United States Patent
Mikawa et al.

(10) Patent No.: US 9,082,974 B2
(45) Date of Patent: Jul. 14, 2015

(54) NONVOLATILE MEMORY ELEMENT, NONVOLATILE MEMORY DEVICE, AND METHODS OF MANUFACTURING THE SAME

(71) Applicant: Panasonic Intellectual Property Management Co., Ltd., Osaka (JP)

(72) Inventors: Takumi Mikawa, Shiga (JP); Hideaki Murase, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 17 days.

(21) Appl. No.: 13/983,071

(22) PCT Filed: Sep. 20, 2012

(86) PCT No.: PCT/JP2012/005968
§ 371 (c)(1),
(2) Date: Aug. 1, 2013

(87) PCT Pub. No.: WO2013/046603
PCT Pub. Date: Apr. 4, 2013

(65) Prior Publication Data
US 2014/0061573 A1 Mar. 6, 2014

(30) Foreign Application Priority Data
Sep. 27, 2011 (JP) ................................. 2011-211434

(51) Int. Cl.
*H01L 21/20* (2006.01)
*H01L 45/00* (2006.01)
*H01L 27/24* (2006.01)

(52) U.S. Cl.
CPC ............ *H01L 45/16* (2013.01); *H01L 27/2409* (2013.01); *H01L 45/08* (2013.01);
(Continued)

(58) Field of Classification Search
CPC ...... H01L 43/02; H01L 43/12; H01L 45/1253; H01L 21/76838; H01L 21/76895; H01L 23/5221; H01L 27/10885; H01L 29/66742; H01L 41/042; H01L 45/085; H01L 45/12; H01L 45/122; H01L 45/1233
USPC ........... 257/2–4, E45.003, E21.004, E29.002; 438/102–104, 381–382
See application file for complete search history.

(56) References Cited

U.S. PATENT DOCUMENTS 6,549,447 B1  4/2003 Fricke et al.
6,707,698 B2  3/2004 Fricke et al.
(Continued)

FOREIGN PATENT DOCUMENTS

JP  2003-188349  7/2003
JP  2010-062265  3/2010
(Continued)

OTHER PUBLICATIONS
International Search Report issued Nov. 13, 2012 in International (PCT) Application No. PCT/JP2012/005968.
(Continued)

*Primary Examiner* — Mark A Laurenzi
(74) *Attorney, Agent, or Firm* — Wenderoth, Lind & Ponack, L.L.P.

(57) ABSTRACT

A nonvolatile memory element includes: a lower electrode formed above a substrate; a first variable resistance layer formed above the lower electrode and comprising a first metal oxide; a second variable resistance layer formed above the first variable resistance layer and comprising a second metal oxide having a degree of oxygen deficiency lower than a degree of oxygen deficiency of the first metal oxide; and an upper electrode formed above the second variable resistance layer. A single step is formed in an interface between the first variable resistance layer and the second variable resistance layer. The second variable resistance layer is formed to cover the step and have, above the step, a bend (or stepped portion) covering the step. The bend, seen from above, has only one corner in a surface of the second variable resistance layer.

20 Claims, 18 Drawing Sheets

(52) U.S. Cl.
CPC ........ *H01L45/1233* (2013.01); *H01L 45/1253* (2013.01); *H01L 45/1273* (2013.01); *H01L 45/146* (2013.01); *H01L 45/1625* (2013.01); *H01L 45/1675* (2013.01); *H01L 27/2463* (2013.01)

(56) References Cited

U.S. PATENT DOCUMENTS

| | | |
|---|---|---|
| 8,022,502 B2 | 9/2011 | Kanzawa et al. |
| 8,389,972 B2 | 3/2013 | Mikawa et al. |
| 2003/0081446 A1 | 5/2003 | Fricke et al. |
| 2003/0161175 A1 | 8/2003 | Fricke et al. |
| 2009/0283736 A1 | 11/2009 | Kanzawa et al. |
| 2011/0220863 A1 | 9/2011 | Mikawa et al. |
| 2011/0294259 A1 | 12/2011 | Kanzawa et al. |

FOREIGN PATENT DOCUMENTS

| | | |
|---|---|---|
| WO | 2008/149484 | 12/2008 |
| WO | 2011/030559 | 3/2011 |

OTHER PUBLICATIONS

Akira Usami et al., "Semiconductor Engineering for Integrated Circuits", Kougyou Chousakai, 1992 with partial English translation.

FIG. 1
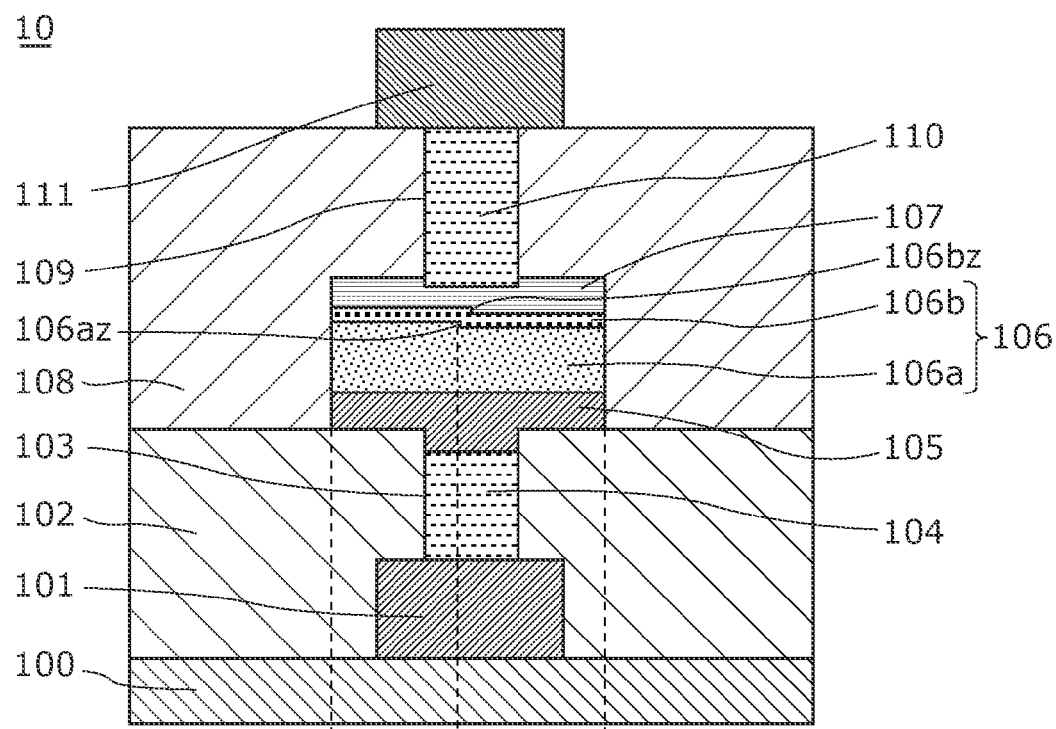
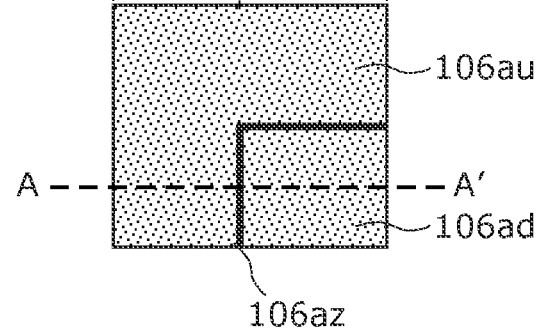

FIG. 2
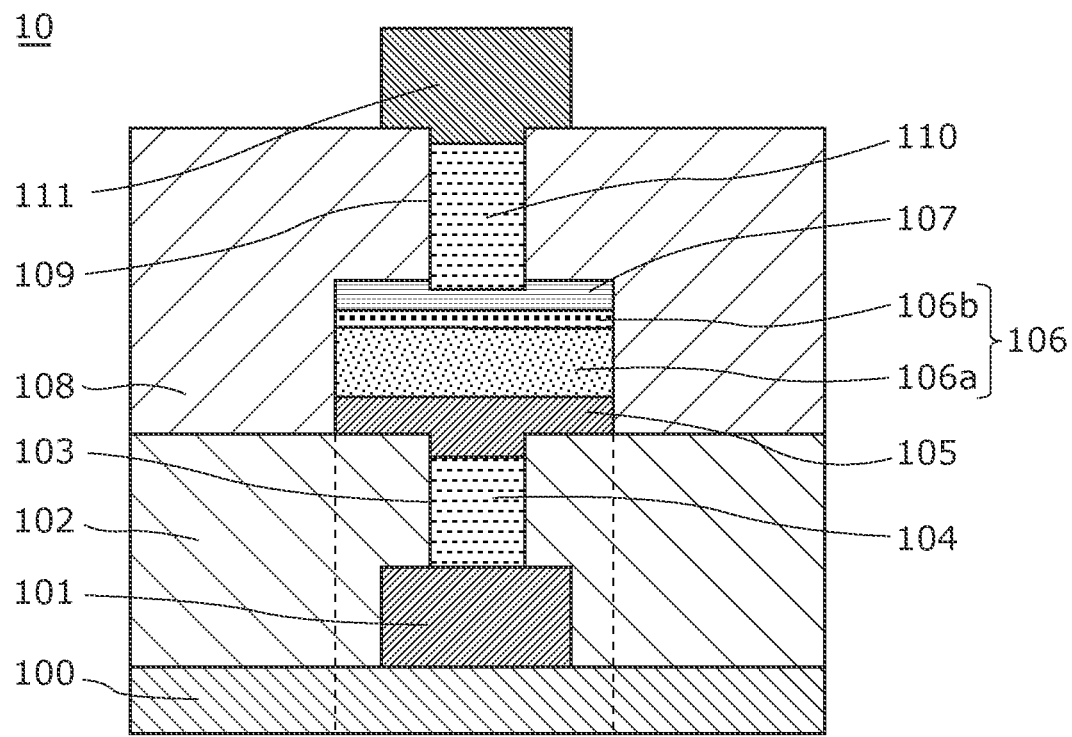
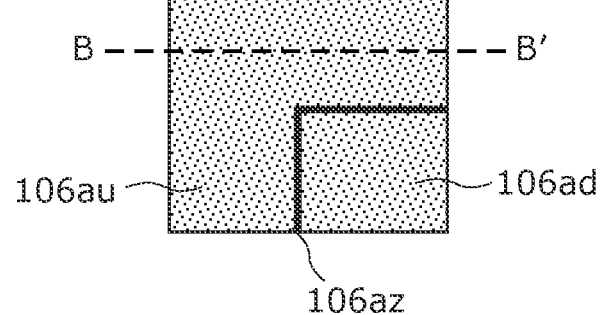

FIG. 8
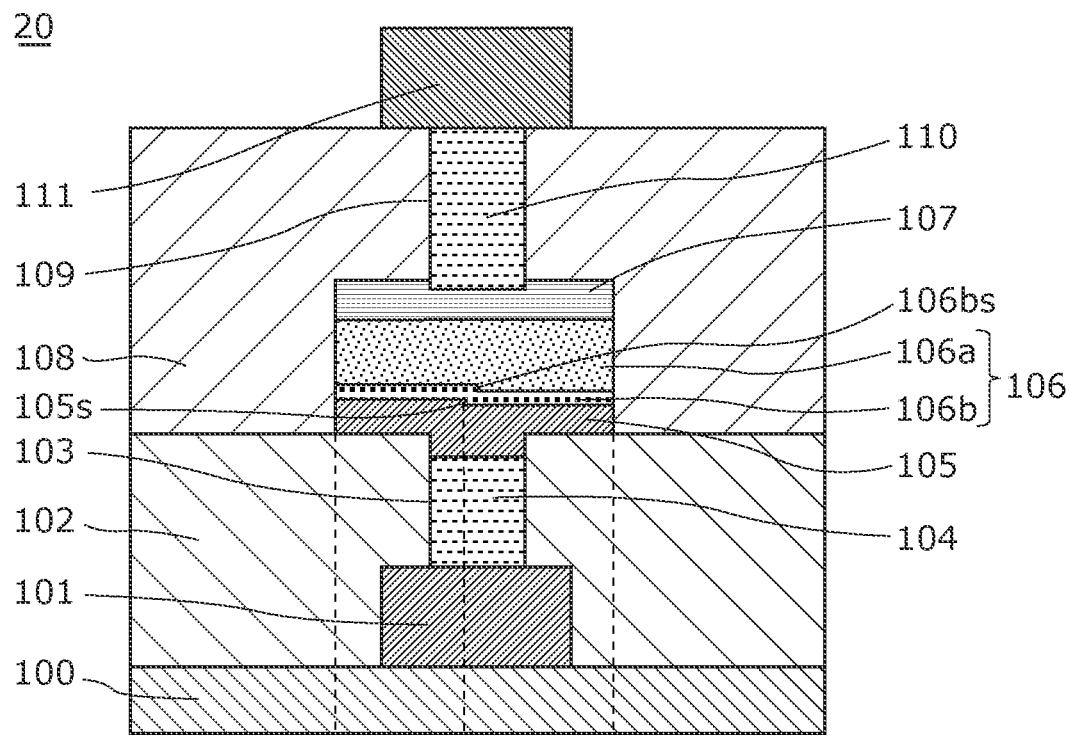
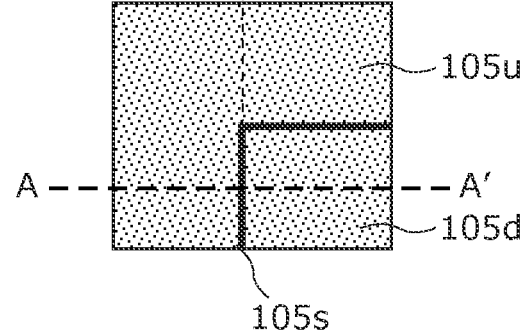

FIG. 9
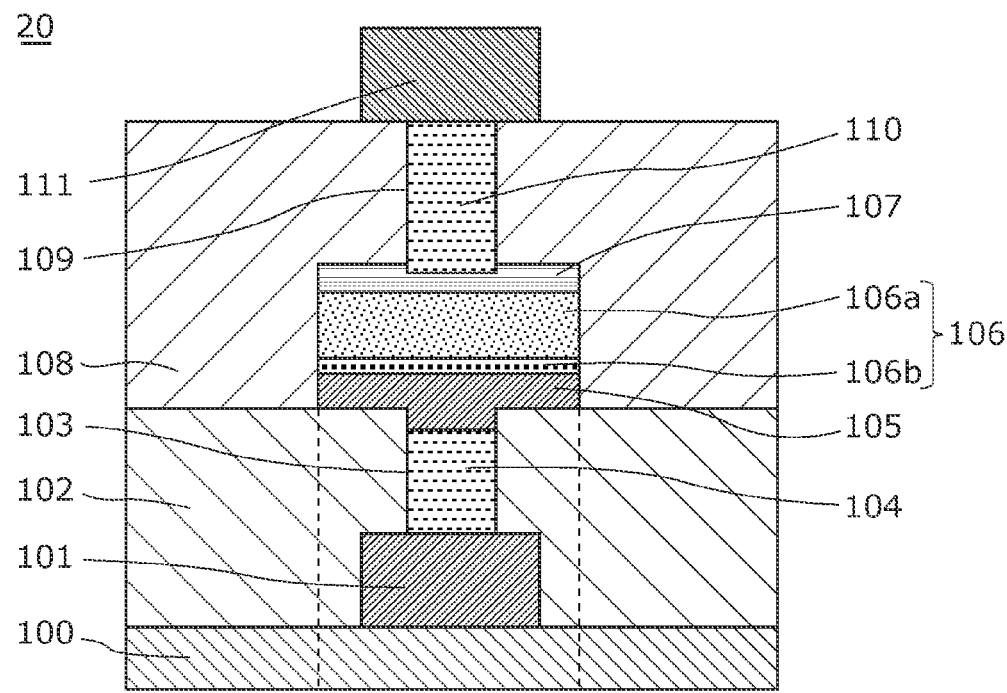
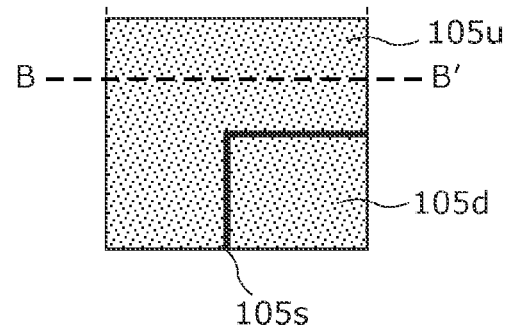

FIG. 14
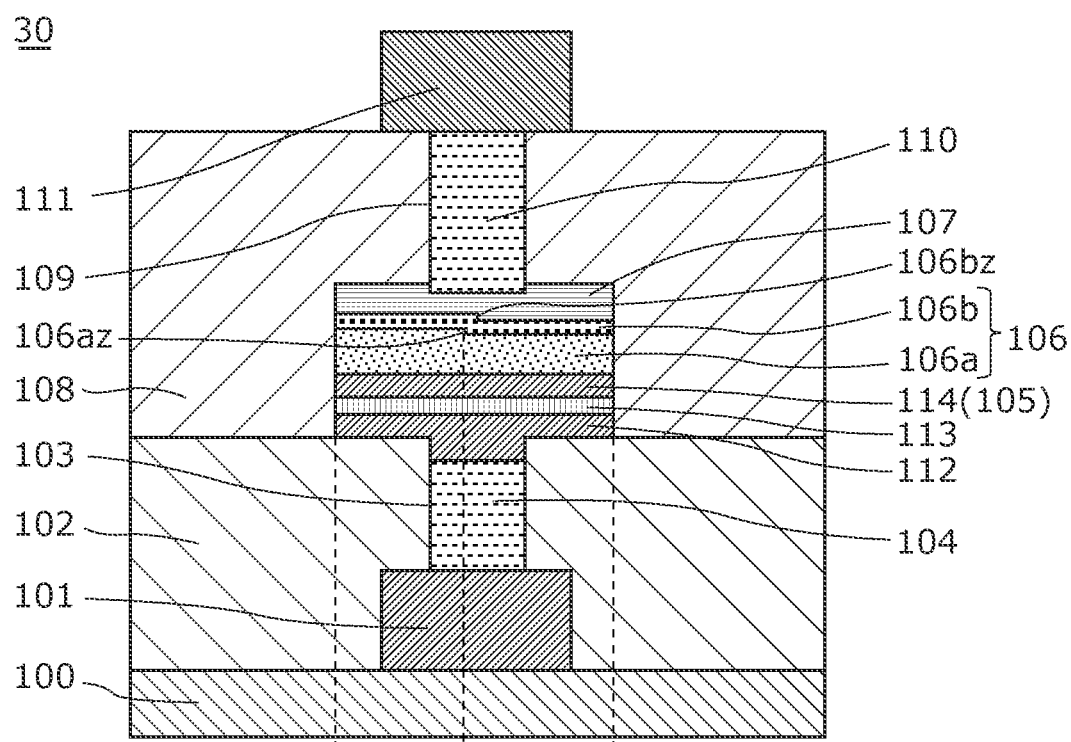
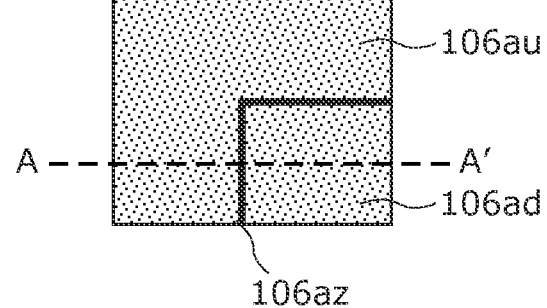

FIG. 15
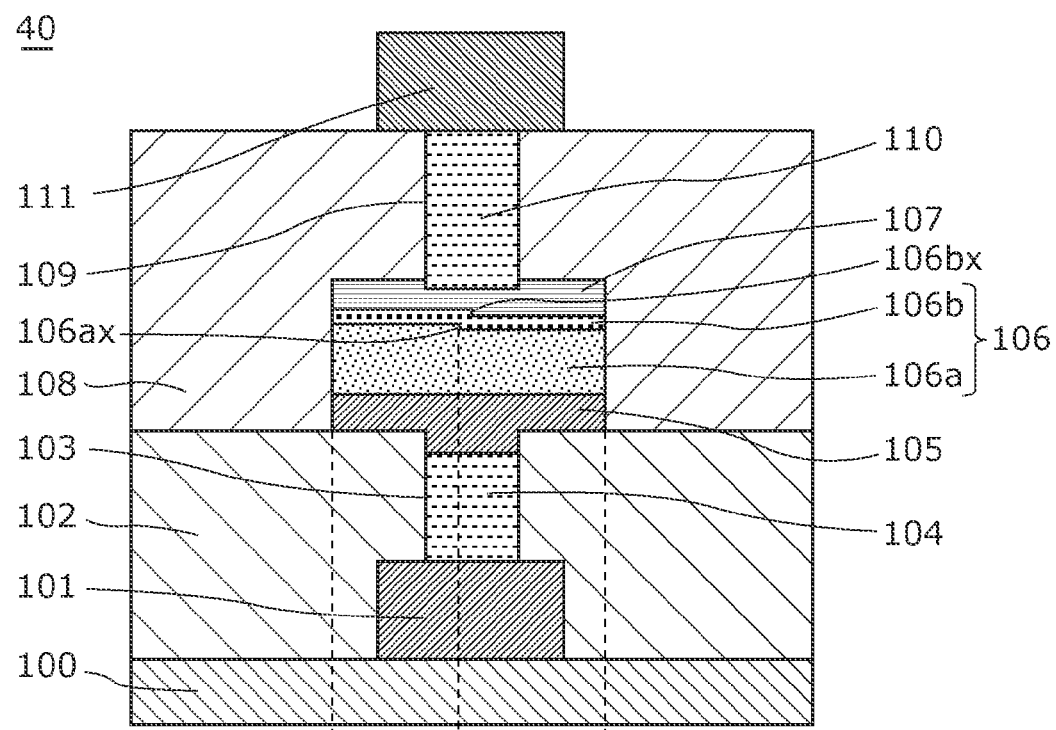
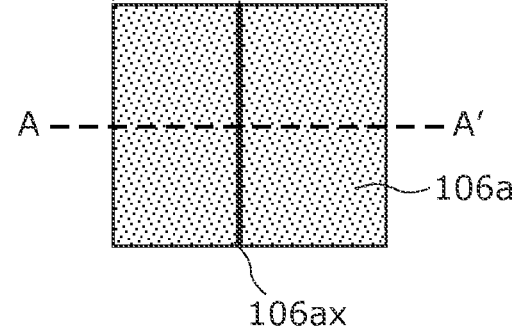

FIG. 16
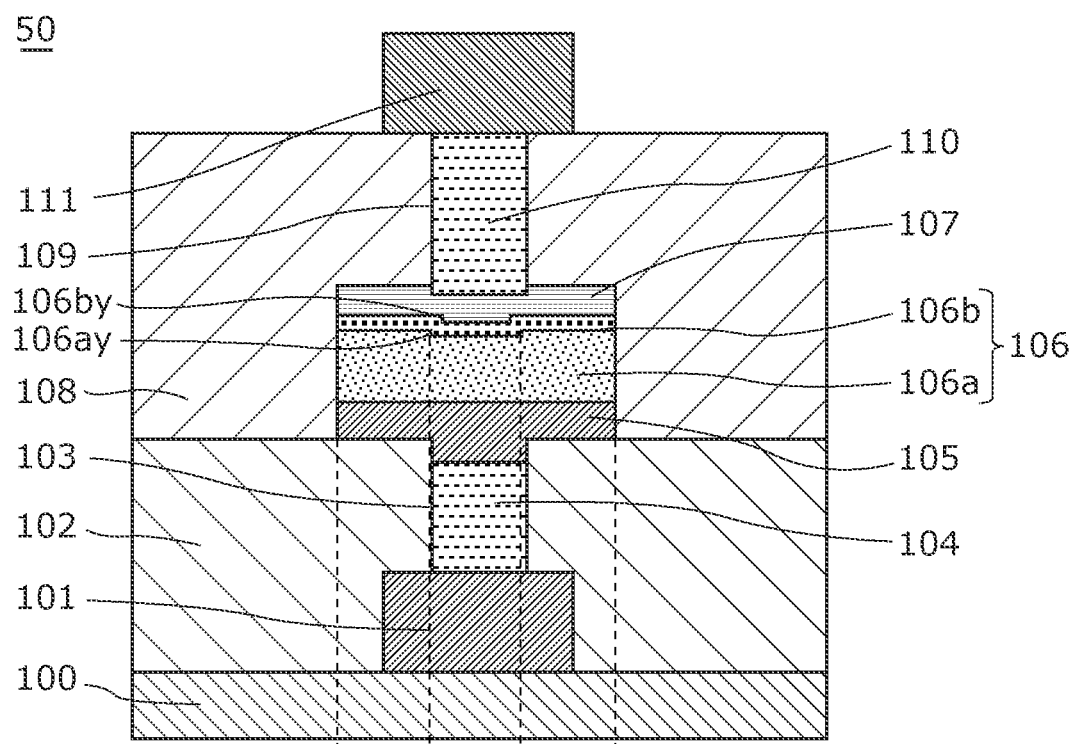
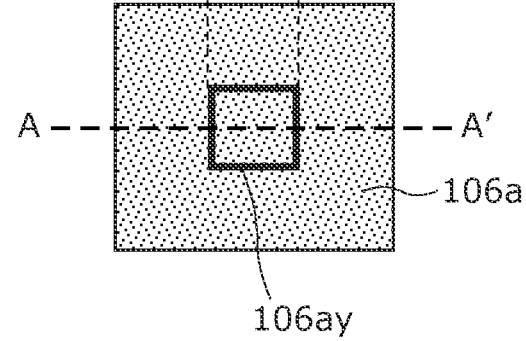

NONVOLATILE MEMORY ELEMENT, NONVOLATILE MEMORY DEVICE, AND METHODS OF MANUFACTURING THE SAME

TECHNICAL FIELD

The present invention relates to a variable resistance nonvolatile memory element and nonvolatile memory device which have a resistance value that changes according to application of voltage pulse, and to methods of manufacturing the same.

BACKGROUND ART

Recent years have seen increasing high performance in electronic devices such as mobile information devices and information appliances following the development of digital technology. With the increased high performance in these electronic devices, miniaturization and increase in speed of semiconductor memory devices used are rapidly advancing. Among these, application for large-capacity nonvolatile memories represented by a flash memory is rapidly expanding. In addition, as a next-generation new-type nonvolatile memory to replace the flash memory, research and development on a variable resistance nonvolatile storage element which uses what is called a variable resistance element is advancing. Here, variable resistance element refers to an element which has a property in which a resistance value reversibly changes according to electrical signals, and is capable of storing information corresponding to the resistance value in a nonvolatile manner.

As an example of such variable resistance element, there is proposed a nonvolatile memory element having a variable resistance layer in which transition metal oxides of different oxygen content atomic percentages are stacked. For example, Patent Literature 1 discloses selectively causing the occurrence of oxidation/reduction reaction in an electrode interface which is in contact with a variable resistance layer having a high oxygen content atomic percentage, to stabilize resistance change.

The aforementioned conventional variable resistance element includes a lower electrode, a variable resistance layer, and an upper electrode, and a memory array is configured from a two-dimensional or three-dimensional array of such variable resistance element. In each of the variable resistance elements, the variable resistance layer is of a stacked structure including a first variable resistance layer and a second variable resistance layer, and the first and second variable resistance layers comprise the same type of transitional metal oxide. The oxygen content atomic percentage of the transitional metal oxide comprised in the second variable resistance layer is higher than the oxygen content atomic percentage of the transitional metal oxide comprised in the first variable resistance layer. By adopting such a structure, when voltage is applied to the variable resistance element, most of the voltage is applied to the second variable resistance layer which has a high oxygen content atomic percentage and exhibits a higher resistance value. Furthermore, oxygen which can contribute to reaction is abundant in the vicinity of the interface between the upper electrode and the second variable resistance layer. Therefore, oxidation/reduction reaction occurs selectively at the interface between the upper electrode and the second variable resistance layer, and stable resistance change can be realized.

With respect to the conventional nonvolatile memory element, the inventors of the present invention have developed a variable resistance nonvolatile memory element and a method of manufacturing the same, capable of lowering the break voltage initially applied to the variable resistance element in order to transition to a state in which resistance change is started, and suppressing variation of break voltage among the elements, as shown in Patent Literature 2.

FIG. 15 (a) is a cross-sectional view (cross-sectional view at A-A' in FIG. 15 (b)) of an exemplary configuration of a conventional first nonvolatile memory element 40, and FIG. 15 (b) is a plan view of a first variable resistance layer 106a in FIG. 15 (a). It should be noted that, hereinafter, a cross-sectional view refers to a diagram of the inside of a plane including a line parallel to the stacking direction of a variable resistance element, and a plan view refers to a view seen from the stacking direction of the variable resistance element.

A first nonvolatile memory element 40 includes a substrate 100 on which a first line 101 is formed, a first interlayer insulating layer 102 formed above the substrate 100, and a first contact plug 104 formed inside a first contact hole 103 which penetrates through the first interlayer insulating layer 102 and reaches the first line 101. In addition, a variable resistance element including a lower electrode 105, a variable resistance layer 106, and an upper electrode 107 is formed covering the first contact plug 104. A second interlayer insulating layer 108 is formed covering the variable resistance element, a second contact hole is formed penetrating through the second interlayer insulating layer 108 and reaching the upper electrode 107, and a second contact plug 110 is formed inside the second contact hole 109. A second line 111 is formed covering the second contact plug 110.

Here, the variable resistance layer 106 is configured of the stacked structure of a first variable resistance layer 106a and a second variable resistance layer 106b. The first variable resistance layer 106a comprises a transitional metal oxide having an oxygen-deficient tantalum oxide ($TaO_x$, $0<x<2.5$) as a primary component. The oxygen content atomic percentage of a second transitional metal oxide forming the second variable resistance layer 106b is higher than the oxygen content atomic percentage of the first transitional metal oxide forming the first variable resistance layer 106a. For example, assuming that the second variable resistance layer 106b comprises a tantalum oxide ($TaO_y$), then $x<y$. When the second variable resistance layer 106b comprises a transitional metal oxide other than tantalum, the second variable resistance layer 106b comprises a material having less degree of oxygen deficiency from the stoichiometric composition exhibiting insulating properties.

A straight step 106ax (height: 1 to 30 nm, length 500 nm) such as that shown in FIG. 15 (b) is formed in the surface (the interface with the second variable resistance layer 106b) of the first variable resistance layer 106a, and a straight bend (i.e., stepped portion) 106bx is created in a surface, above the step 106ax, of the second variable resistance layer 106b formed above the first variable resistance layer 106a.

FIG. 16 (a) is a cross-sectional view (cross-sectional view at A-A' in FIG. 16 (b)) of an exemplary configuration of a conventional second nonvolatile memory element 50, and FIG. 16 (b) is a plan view of the first variable resistance layer 106a in FIG. 16 (a).

The difference between the second nonvolatile memory element 50 and the first nonvolatile memory element 40 is in the shape of the step formed in the first variable resistance layer 106a. In the first nonvolatile memory element 40, the step 106ax formed in the surface of the first variable resistance layer 106a is straight, whereas, in the second nonvolatile memory element 50, a ring-shaped step 106ay is formed.

Accordingly, a bend i.e., stepped portion) 106*by* of the second variable resistance layer 106*b* is also ring-shaped.

According to the configurations in FIG. 15 and FIG. 16, the bend 106*bx* or 106*by* of the second variable resistance layer 106*b* is formed above the step 106*ax* or 106*ay* of the first variable resistance layer 106*a*, and thus it is possible to cause the initial break phenomenon even with a low voltage, with the bend 106*bx* or 106*by* as a starting point. Furthermore, since the step shape is formed in an intentional and controlled manner, the shape of the bend of the second variable resistance layer 106*b* is stable, and thus variation in break voltage does not increase. With this, lowering the initial break voltage and suppressing variation therein can both be achieved.

FIG. 17A (a) is a cross-sectional view (cross-sectional view at A-A' in FIG. 17A (b)) of an exemplary configuration of a conventional third nonvolatile memory element 60, FIG. 17A (b) is a plan view of the first variable resistance layer 106*a* in FIG. 17A (a), and FIG. 17B is a perspective view of the first variable resistance layer 106*a* in FIG. 17A.

The difference between the third nonvolatile memory element 60 and the first nonvolatile memory element 40 is in the shape of the step formed in the first variable resistance layer 106*a*. Specifically, in the first nonvolatile memory element 40, the step 106*ax* formed in the surface of the first variable resistance layer 106*a* is a single straight step, whereas, in the third nonvolatile memory element 60, the two linear steps of steps 106*ax*1 and 106*ax*2 are formed in the surface of the first variable resistance layer 106*a*, and a crossing point of the steps 106*ax*1 and 106*ax*2 is formed at the central part of the element. The first variable resistance layer 106*a* is segmented into four regions, with the crossing point as a starting point. According to this configuration, the largest bend 106*bx* of the second variable resistance layer 106*b* is created above the crossing point of the steps 106*ax*1 and 106*ax*2 of the first variable resistance layer 106*a*, and thus it is possible to cause the break phenomenon even with a low voltage, with the bend 106*bx* as a starting point.

CITATION LIST

Patent Literature

[PTL 1] International Publication No. 2008/149484
[PTL 2] International Publication No. 2011/030559

SUMMARY OF INVENTION

Technical Problem

However, when the above described conventional variable resistance nonvolatile memory elements are miniaturized, there arises the problem that the surface area of the variable resistance element becomes smaller, and the distance between the position of the filament formed by the application of the break voltage and the edges of the variable resistance element (edges in directions orthogonal with the stacking direction of the variable resistance layer 106) becomes relatively close. Specifically, compositional distortion and oxygen deficiency due to etching damage occurs at the edges of the variable resistance element, and variation in resistance change characteristics in a filament formed in such a region is said to be great. The compositional distortion and oxygen deficiency in a transition metal oxide caused by etching damage becomes a factor for the variation in the resistance of a memory cell (variable resistance element), and the problem becomes obvious when this leads to cell current fluctuation. On the other hand, in the manufacturing method, with the reduction in the size of the variable resistance element, misalignment with the mask for forming a step affects the resistance change characteristics.

The present invention is conceived to solve the aforementioned problems and has as an object to provide (i) a variable resistance nonvolatile memory element and nonvolatile memory device that are capable of lowering break voltage, and suppressing variation of resistance change characteristics among the elements, and (ii) methods of manufacturing the same.

Solution to Problem

In order to achieve the aforementioned object, a method of manufacturing a nonvolatile memory device according to an aspect of the present invention includes: forming a lower electrode above a substrate; forming a first variable resistance layer above the lower electrode, the first variable resistance layer comprising a first metal oxide and having a single step in a surface; forming a second variable resistance layer to cover the step of the first variable resistance layer and have, above the step, a bend that covers the step, the second variable resistance layer comprising a second metal oxide having a degree of oxygen deficiency that is lower than a degree of oxygen deficiency of the first metal oxide; and forming an upper electrode above the second variable resistance layer, wherein in the forming of a first variable resistance layer, the step is formed so that the step is at most a single step and, as seen from above, has only one corner in the surface of the first variable resistance layer.

Advantageous Effects of Invention

The nonvolatile memory element in the present invention lowers break voltage and reduces variation in break voltage by intentionally forming a step in the surface of the base layer of the second variable resistance layer and thereby stably forming a locally thin-filmed or bent part in the second variable resistance layer on the step. In addition, since a filament is created with just a single corner of a bend (i.e., stepped portion) within the variable resistance element as a starting point, a filament can be formed in the vicinity of the center of the variable resistance element which is away from the edges of the variable resistance element, and thus miniaturization and increased capacity of memories can be realized.

BRIEF DESCRIPTION OF DRAWINGS

FIG. 1 shows, in (a), a cross-sectional view showing an exemplary configuration of a nonvolatile memory element in Embodiment 1 of the present invention, and shows, in (b), a plan view of a first variable resistance layer of the same nonvolatile memory element.

FIG. 2 shows, in (a), a cross-sectional view showing the exemplary configuration of the nonvolatile memory element in Embodiment 1 of the present invention, and shows, in (b), a plan view of the first variable resistance layer of the nonvolatile memory element.

FIG. 8 shows, in (a), a cross-sectional view showing the exemplary configuration of a nonvolatile memory element in Embodiment 2 of the present invention, and shows, in (b), a plan view of a lower electrode of the same nonvolatile memory element.

FIG. 9 shows, in (a), a cross-sectional view showing the exemplary configuration of a nonvolatile memory element in Embodiment 2 of the present invention, and shows, in (b), a plan view of the lower electrode of the same nonvolatile memory element.

FIG. 14 shows, in (a), a cross-sectional view showing an exemplary configuration of a nonvolatile memory element in Embodiment 3 of the present invention, and shows, in (b), a plan view of a first variable resistance layer of the same nonvolatile memory element.

FIG. 15 shows, in (a), a cross-sectional view showing an exemplary configuration of a conventional first nonvolatile memory element, and shows, in (b), a plan view of a first variable resistance layer of the conventional first nonvolatile memory element.

FIG. 16 shows, in (a), a cross-sectional view showing an exemplary configuration of a conventional second nonvolatile memory element, and shows, in (b), a plan view of a second variable resistance layer of the conventional second nonvolatile memory element.

Figure 3:
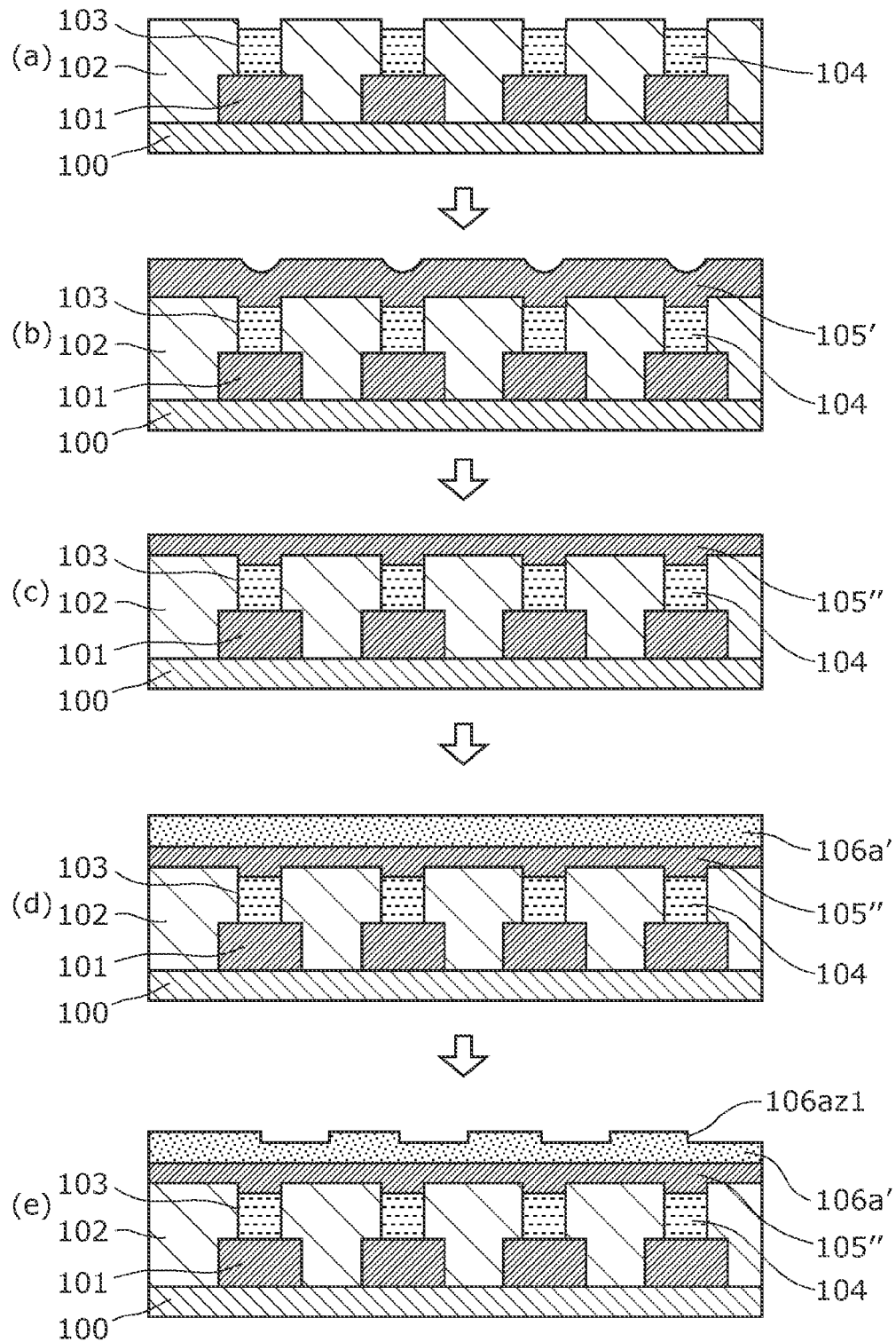
FIG. 3 shows, in (a) to (e), cross-sectional views illustrating a first manufacturing method for main parts of the nonvolatile memory element in Embodiment 1 of the present invention.

DESCRIPTION OF EMBODIMENTS (Underlying Knowledge Forming Basis of the Present Invention)

In the above-described first nonvolatile memory element 40, the break phenomenon occurs at any part of the bend (i.e., stepped portion) 106bx of the second variable resistance layer 106b, above the straight step 106ax of the first variable resistance layer 106a. Therefore, a filament is not necessarily formed at the center of the variable resistance element (center of the plane including the direction orthogonal to the stacking direction of the variable resistance layer 106), and thus the effects of miniaturization are easily felt and resistance change characteristics vary.

Next, in the above-described conventional second nonvolatile memory element 50, the bend (i.e., stepped portion) 106by of the second variable resistance layer 106b2 is formed above the ring-shaped step 106ay of the first variable resistance layer 106a. Therefore, a filament is created with the bend 106by as a starting point, in particular, with a significantly-curved corner of the bend 106by which is ring-shaped in the planar view as a starting point. There are four corners in the ring-shaped bend 106by and the corner at which the filament is created is a matter of probability, and thus the position of the filament differs depending on the variable resistance element and resistance change characteristics vary. This becomes a cause of memory bit variation. Furthermore, the ring-shaped step 106ay needs to be formed smaller than the size of the variable resistance element, and thus there is the problem that the ring-shaped step pattern limits miniaturization. It should be noted that in the present Description, a bend (i.e., stepped on indicates a part that is curved in a direction perpendicular to the surface of the substrate. In addition, a corner is a part that is curved in a direction perpendicular to the surface of the substrate and curved in a direction parallel to the surface of the substrate.

Lastly, in the above-described conventional third nonvolatile memory element 60, electric fields easily concentrate at the crossing point of plural steps, and thus the location of the break can be fixed. However, since the plural steps are created by being patterned using two masks, misalignment increases compared to a variable resistance element in which patterning is performed using one mask, and thus resistance change characteristics vary. Therefore, it is still insufficient as far as miniaturization is concerned.

In view of this, a method of manufacturing a nonvolatile memory device according to an aspect of the present invention includes: forming a lower electrode above a substrate; forming a first variable resistance layer above the lower electrode, the first variable resistance layer comprising a first metal oxide and having a single step in a surface; forming a second variable resistance layer to cover the step of the first variable resistance layer and have, above the step, a bend (i.e., stepped portion) that covers the step, the second variable resistance layer comprising a second metal oxide having a degree of oxygen deficiency that is lower than a degree of oxygen deficiency of the first metal oxide; and forming an upper electrode above the second variable resistance layer, wherein in the forming of a first variable resistance layer, the step is formed so that the step is at most a single step and, as seen from above, has only one corner in the surface of the first variable resistance layer. Here, the bend refers to a part at which the second variable resistance layer bends due to the influence of an non-continuous step formed in the base, and does not include a bend caused by a gradually-changing, gentle step shape.

Furthermore, a method of manufacturing a nonvolatile memory device according to an aspect of the present invention includes: forming a lower electrode above a substrate, the lower electrode having a single step in a surface; forming a second variable resistance layer to cover the step of the lower electrode and have, above the step, a bend that covers the step, the second variable resistance layer comprising a second metal oxide; forming a first variable resistance layer above the second variable resistance layer, the first variable resistance layer comprising a first metal oxide having a degree of oxygen deficiency that is higher than a degree of oxygen deficiency of the second metal oxide; and forming an upper electrode above the first variable resistance layer, wherein, in the forming of a lower electrode, the step is formed so that the step is at most a single step and, as seen from above, has only one corner in the surface of the lower electrode.

By adopting the above manufacturing method, it is possible to reflect the shape of the step of the base and stably form the bend in the second variable resistance layer on the step, and thus it is possible to cause the break phenomenon even with a low voltage, with the bend as a starting point. Furthermore, since the shape of the step can be formed with intentional control, the shape of the bend of the second variable resistance layer becomes stable, and thus variation in break voltage does not increase. Furthermore, since a filament is created with, as a starting point, a corner of a bend above only a single corner of the step within the variable resistance element, it is possible to suppress variations in break voltage and resistance change characteristics among elements and realize a variable resistance nonvolatile memory element capable of accommodating miniaturization.

Here, in the forming of a first variable resistance layer, the step may be formed so that, as seen from above, the corner of the step is located at a center in the surface of the first variable resistance layer.

Furthermore, in the forming of a lower electrode, the step may be formed so that, as seen from above, the corner of the step is located at a center in the surface of the lower electrode.

By adopting such a configuration, a filament can be formed in the vicinity of the center of the variable resistance element which is away from the edges of the variable resistance element, and thus miniaturization and increased capacity of memories can be realized.

Furthermore, in the forming of a first variable resistance layer, the first variable resistance layer having the single step in the surface may be formed by forming the first variable resistance layer, forming the step in the surface of the formed first variable resistance layer, and patterning the first variable resistance layer in which the step has been formed, in the forming of a second variable resistance layer, the second variable resistance layer may be formed by forming the second variable resistance layer and patterning the formed second variable resistance layer, and in the forming of a upper electrode, the upper electrode may be formed by forming the upper electrode and patterning the formed upper electrode.

Furthermore, in the forming of a lower electrode, the lower electrode having the single step in the surface may be formed by forming the lower electrode, forming the step in the surface of the formed lower electrode, and patterning the lower electrode in which the step has been formed, in the forming of a first variable resistance layer, the first variable resistance layer may be formed by forming the first variable resistance layer and patterning the formed first variable resistance layer, in the forming of a second variable resistance layer, the second variable resistance layer may formed by forming the second variable resistance layer patterning the formed second variable resistance layer, and in the forming of a upper electrode, the upper electrode may be formed by forming the upper electrode and patterning the formed upper electrode.

Furthermore, in the forming of a first variable resistance layer, the first variable resistance layer having the single step in the surface may be formed by forming the first variable resistance layer, forming the step in the surface of the formed first variable resistance layer, and patterning the first variable resistance layer in which the step has been formed, and in the forming of a first variable resistance layer, the step may be formed in such a way that a side of an opening of a mask used for forming the step is larger than a smallest dimension of the first variable resistance layer after the patterning as seen from above.

Furthermore, in the forming of a first variable resistance layer, the first variable resistance layer having the single step in the surface may be formed by forming the first variable resistance layer, forming the step in the surface of the formed first variable resistance layer, and patterning the first variable resistance layer in which the step has been formed, and in the forming of a first variable resistance layer, the step may be formed in such a way that a side of a mask used for forming the step is larger than a smallest dimension of the first variable resistance layer after the patterning as seen from above.

Furthermore, in the forming of a lower electrode, the lower electrode having the single step in the surface may be formed by forming the lower electrode, forming the step in the surface of the formed lower electrode, and patterning the lower electrode in which the step has been formed, and in the forming of a lower electrode, the step may formed in such a way that a side of an opening of a mask used for forming the step is larger than a smallest dimension of the lower electrode after the patterning as seen from above.

Furthermore, in the forming of a lower electrode, the lower electrode having the single step in the surface may be formed by forming the lower electrode, forming the step in the surface of the formed lower electrode, and patterning the lower electrode in which the step has been formed, and in the forming of a lower electrode, the step may be formed in such a way that a side of a mask used for forming the step is larger than a smallest dimension of the lower electrode after the patterning as seen from above.

Furthermore, method of manufacturing a nonvolatile memory device according to an aspect of the present invention is a method of manufacturing a nonvolatile memory device including a plurality of the nonvolatile memory elements, using the method of manufacturing a nonvolatile memory element described above, and includes: in the forming of a first variable resistance layer, separating the single first variable resistance layer into a plurality of the first variable resistance layers corresponding to the nonvolatile memory elements through the patterning; and in the forming of a first variable resistance layer, forming the step so that the single step of the first variable resistance layer before the patterning in which the step has been formed, as seen from above, extends across the first variable resistance elements after the patterning.

Furthermore, method of manufacturing a nonvolatile memory device according to an aspect of the present invention is a method of manufacturing a nonvolatile memory device including a plurality of the nonvolatile memory elements, using the method of manufacturing a nonvolatile memory element described above, and includes: in the forming of a lower electrode, separating the single lower electrode into a plurality of the lower electrodes corresponding to the nonvolatile memory elements through the patterning; and in the forming of a lower electrode, forming the step so that the single step of the lower electrode before the patterning in which the step has been formed, as seen from above, extends across the lower electrodes after the patterning.

Furthermore, by forming a common step across adjacent variable resistance elements, the need to form the step in the surface of the first variable resistance layer or the electrode before patterning as seen from above to be smaller than the variable resistance element is eliminated, and thus the problem of miniaturization being limited by the step pattern can be solved.

Furthermore, a nonvolatile memory element according to an aspect of the present invention includes: a substrate; a lower electrode formed above the substrate; a first variable resistance layer formed above the lower electrode and comprising a first metal oxide; a second variable resistance layer formed above the first variable resistance layer and comprising a second metal oxide having a degree of oxygen deficiency that is lower than a degree of oxygen deficiency of the first metal oxide; and an upper electrode formed above the second variable resistance layer, wherein at most a single step is formed in an interface between the first variable resistance layer and the second variable resistance layer, the second variable resistance layer is formed to cover the step and have, above the step, a bend that covers the step, and the bend, as seen from above, has only one corner in a surface of the second variable resistance layer.

By adopting such a configuration, the shape of the step of the first variable resistance layer is reflected, thereby forming the bend in the second variable resistance layer on the step, and thus it is possible to cause the break phenomenon even with a low voltage, with the bend as a starting point. Furthermore, since the shape of the step can be formed with intentional control, the shape of the bend of the second variable resistance layer becomes stable, and thus variation in break voltage does not increase. Furthermore, since a filament is created with only a single corner of the bend within the variable resistance element as a starting point, it is possible to suppress variations in break voltage and resistance change characteristics among elements and realize a variable resistance nonvolatile memory element capable of accommodating miniaturization.

Here, the nonvolatile memory element may further include a contact plug below the lower electrode, wherein an interface between the lower electrode and the first variable resistance layer may be flat.

For example, even when a recess is created above the contact plug, the lower electrode above the recess thick can be made thick, and thus the surface of the lower electrode can be planarized. The shape and film thickness of the second variable resistance layer at the bend is dependent only on the shape of the step of the first variable resistance layer, and is not affected by the shape of the base in a further lower layer. Thus, it is possible to reduce variation in resistance change characteristics between each bit caused by the base.

Furthermore, a nonvolatile memory element according to an aspect of the present invention includes: a substrate; a lower electrode formed above the substrate; a second variable resistance layer formed above the lower electrode and comprising a second metal oxide; a first variable resistance layer formed above the second variable resistance layer and comprising a first metal oxide having a degree of oxygen efficiency that is higher than a degree of oxygen deficiency of the second metal oxide; and an upper electrode formed above the first variable resistance layer, wherein at most a single step is formed in an interface between the lower electrode and the second variable resistance layer, the second variable resistance layer is formed to cover the step and have, above the step, a bend that covers the step, and the bend, as seen from above, has only one corner in a surface of the second variable resistance layer.

By adopting such a configuration, the shape of the step of the lower electrode is reflected, thereby forming the bend in the second variable resistance layer on the step, and thus it is possible to cause the break phenomenon even with a low voltage, with the bend as a starting point. Furthermore, since the shape of the step can be formed with intentional control, the shape of the bend of the second variable resistance layer becomes stable, and thus variation in break voltage does not increase. Furthermore, since a filament is created with only a single corner of the bend within the variable resistance element as a starting point, it is possible to suppress variations in break voltage and resistance change characteristics among elements and realize a variable resistance nonvolatile memory element capable of accommodating miniaturization.

Here, the corner of the bend, as seen from above, may be located at a center in the surface of the second variable resistance layer.

By adopting such a configuration, a filament can be formed in the vicinity of the center of the variable resistance element which is away from the edges of the variable resistance element, and thus miniaturization and increased capacity of memories can be realized.

Furthermore, the second variable resistance layer may be an insulating layer.

Adopting such a configuration in a situation where the problem connected with initial break is revealed, makes it possible to address such problem.

Furthermore, the first metal oxide and the second metal oxide may each comprise an oxide of tantalum, hafnium, or zirconium.

These materials have excellent retention characteristics for variable resistance elements and are materials that allow high-speed operation, and by using such materials as a material of a variable resistance layer that requires an initial break at the start of resistance change, the break characteristics thereof can made extremely stable.

Furthermore, the nonvolatile memory element may include a diode element that is in contact with the lower electrode or the upper electrode.

In a memory cell structure in which the variable resistance element and the diode element are connected in series, it is necessary to add a voltage portion to be distributed to the diode element and raise the voltage to be applied to the memory cell, and thus the demand for lowering the voltage becomes greater. In the nonvolatile memory device in the present invention, the break voltage of the variable resistance element can be lowered, and thus the voltage applied to the memory cell overall can be lowered. Furthermore, since the break phenomenon of the variable resistance element occurs locally, transient current flowing at the time of the break can be reduced. With this, destruction of the diode element can also be prevented.

Furthermore, a nonvolatile memory device according to an aspect of the present invention includes a plurality of the nonvolatile memory elements described above, wherein a relative positional relationship between the corner of the bend and two straight lines making up the corner, as seen from above, is different for each of the nonvolatile memory elements.

By adopting such a configuration, it becomes possible to form a common step across adjacent variable resistance elements. Therefore, the need to form the step pattern smaller than the variable resistance element is eliminated, and thus the problem of miniaturization being limited by the step pattern can be solved.

Hereinafter, embodiments of the present invention shall be described with reference to the Drawings. It should be noted that the exemplary embodiment described below shows one specific example. The numerical values, shapes, materials, structural components, the arrangement and connection of the structural components, steps, the processing order of the steps, etc. shown in the following exemplary embodiments are mere examples, and therefore do not limit the scope of the appended claims and theft equivalents. The present invention is defined by the Claims. Thus, among the structural elements in the following embodiments, structural elements not recited in any one of the independent claims, which are generic concepts of the present invention, are not necessarily required to achieve the object of the present invention but are described as structural elements included in a more preferable form. Furthermore, in the Drawings, structural elements having substantially the same configuration, operation, and effect are given the same reference sign.

Embodiment 1

[Element Configuration]

FIG. 1 (a) is a cross-sectional view (cross-sectional view at A-A' in FIG. 1 (b)) of an exemplary configuration of a nonvolatile memory element 10 in Embodiment 1 of the present invention, and FIG. 1 (b) is a plan view of a first variable resistance layer 106a in FIG. 1 (a). Furthermore, FIG. 2 (a) is a cross-sectional view (cross-sectional view at B-B' in FIG. 2 (b)) of an exemplary configuration of the nonvolatile memory element 10 in Embodiment 1 of the present invention, and FIG. 2 (b) is a plan view of a first variable resistance layer 106a in FIG. 2 (a). It should be noted that FIG. 1 (a) and FIG. 2 (a) show cross-sectional views at different positions of the same nonvolatile memory element 10.

As shown in FIG. 1 and FIG. 2, the nonvolatile memory element 10 in Embodiment 1 includes: a substrate 100; a lower electrode 105 formed above the substrate 100; the first variable resistance layer 106a formed on the lower electrode 105 and comprising a first metal oxide; a second variable resistance layer 106b formed on the first variable resistance layer 106a and comprising a second metal oxide having a degree of oxygen deficiency lower than the degree of oxygen deficiency of the first metal oxide; and an upper electrode 107 formed on the second variable resistance layer 106b. There is a single step 106az in the interface between the first variable resistance layer 106a and the second variable resistance layer 106b. The second variable resistance layer 106b is formed covering the step 106az and includes, above the step 106az, a bend (i.e., stepped portion) 106bz which covers the step 106az. When seen from above, the bend 106bz has only one corner in the surface of the second variable resistance layer 106b.

A variable resistance layer 106 is interposed between the lower electrode 105 and the upper electrode 107, and is a layer having a resistance value that reversibly changes based on an electrical signal applied between the lower electrode 105 and the upper electrode 107. For example, the variable resistance layer 106 is a layer that reversibly transitions between a high resistance state and a low resistance state according to the polarity of the voltage applied between the lower electrode 105 and the upper electrode 107.

The first variable resistance layer 106a comprises an oxygen-deficient first metal oxide, and the second variable resistance layer 106b comprises a second metal oxide having a degree of oxygen deficiency lower than the degree of oxygen deficiency of the first metal oxide. A minute local region having a degree of oxygen deficiency that reversibly changes according to the application of an electric pulse is formed in the second variable resistance layer 106b of the nonvolatile memory element 10. It is thought that the local region includes a filament configured from an oxygen defect site. For the metal included in the variable resistance layer, a transition metal or aluminum (Al) can be used.

Here, the nonvolatile memory element 10 further includes a first contact plug 104 formed below the lower electrode 105, and the interface between the lower electrode 105 and the first variable resistance layer 106a is flat. Furthermore, the corner of the bend 106bz as seen from above is located at the center, in the surface of the second variable resistance layer 106b. Moreover, the second variable resistance film 106b is an insulating layer. In addition, the first metal oxide and the second metal oxide comprise, for example, an oxide of tantalum, hafnium, or zirconium.

It should be noted that although the corner of the bend 106bz is located at the center in the surface of the second variable resistance layer 106b, this center refers to the median point in the case where the second variable resistance layer 106b has a polygonal shape or elliptical shape when seen from above. Furthermore, this center does not mean the precise center, but an approximate center that includes positions displaced within the range of manufacturing variations.

The nonvolatile memory element 10 in Embodiment 1 shall be described in detail below.

As shown in FIG. 1 and FIG. 2, the nonvolatile memory element 10 in Embodiment 1 includes: the substrate 100 on which the first line 101 is formed; a first interlayer insulating layer 102 comprising a silicon oxide film (film thickness: 500 to 1000 nm) formed on the substrate 100 and covering the first line 101; and a first contact plug 104 which has tungsten (W) as a primary component and is formed by being filled into a first contact hole 103 (diameter: 50 to 300 nm) which penetrates through the first interlayer insulating layer 102 and reaches (is electrically connected to) the first line 101.

The top plane of the first contact plug 104 and the top plane of the first interlayer insulating layer 102 are not continuous (i.e., not coplanar), and a recess (depth: 5 to 50 nm) is created in the non-continuous part. In addition, a variable resistance element (50 to 300 nm square) is formed on the first interlayer insulating layer 102, covering the first contact plug 104. This variable resistance element includes: the lower electrode 105 (film thickness: 5 to 100 nm) comprising tantalum nitride (TaN); the variable resistance layer 106 (film thickness: 20 to 100 nm); and the upper electrode 107 (film thickness: 5 to 100 nm) comprising a noble metal (platinum (Pt), iridium (Ir), palladium (pd), and the like). A second interlayer insulating layer 108 comprising a silicon oxide film (SiO, film thickness: 500 to 1000 nm) is formed covering the variable resistance element, a second contact hole 109 (diameter: 50 to 300 nm) is formed penetrating through the second interlayer insulating layer 108 and reaching the upper electrode 107, and a second contact plug 110 having tungsten (W) as a primary component is formed inside the second contact hole 109. The second line 111 is formed on the second interlayer insulating layer 108 and covering the second contact plug 110. It should be noted that the step created on the first contact plug 104 is not transferred onto the surface of the lower electrode 105, and thus the surface of the lower electrode 105 is extremely flat throughout its entirety, and a continuous plane (flat plane) is maintained.

Here, the variable resistance layer 106 is configured of the stacked structure of the first variable resistance layer 106a (film thickness: 18 to 95 nm) and the second variable resistance layer 106b (film thickness: 2 to 10 nm). The first variable resistance layer 106a comprises the first metal oxide having an oxygen-deficient tantalum oxide ($TaO_x$, $0<x<2.5$) as a primary component.

The oxygen content atomic percentage of the second metal oxide forming the second variable resistance layer 106b is higher than the oxygen content atomic percentage of the first metal oxide forming the first variable resistance layer 106a, and is denoted by x<y when, for example, the second variable resistance layer 106b comprises a tantalum oxide ($TaO_y$). When the second variable resistance layer 106b comprises a metal other than tantalum, the second variable resistance layer 106b comprises a material having less degree of oxygen deficiency from the stoichiometric composition exhibiting insulating properties.

Stated differently, the degree of oxygen deficiency of the second metal oxide forming the second variable resistance layer 106b is lower than the degree of oxygen deficiency of the first metal oxide forming the first variable resistance layer 106a.

"Degree of oxygen deficiency" refers to the percentage of deficient oxygen with respect to the amount of oxygen comprising an oxide of the stoichiometric composition (in the case where there are plural stoichiometric compositions, the stoichiometric composition having the highest resistance value among the stoichiometric compositions) in the metal oxide. Compared to a metal oxide with another composition, a metal oxide having a stoichiometric composition is more stable and has a higher resistance value. For example, when the metal is tantalum (Ta), the oxide having the stoichiometric composition according to the above-described definition is $Ta_2O_5$, and thus can be expressed as $TaO_{2.5}$. The degree of oxygen deficiency of $TaO_{2.5}$ is 0%, and the degree of oxygen deficiency of $TaO_{1.5}$ becomes: degree of oxygen deficiency=(2.5−1.5)/2.5=40%. Furthermore, a metal oxide having excess oxygen has a degree of oxygen deficiency with a negative value. It should be noted that in this Description, unless stated otherwise, the degree of oxygen deficiency includes positive values, 0 (zero), and negative values.

"Oxygen content atomic percentage" is the percentage of the total number of atoms occupied by oxygen atoms. For example, an oxide having a lower degree of oxygen deficiency has a higher resistance value since it is closer to an oxide having a stoichiometric composition, and an oxide having a higher degree of oxygen deficiency has a lower resistance value since it is closer to the metal included in the oxide.

The "oxygen content atomic percentage" is the percentage of the total number of atoms occupied by oxygen atoms. For example, the oxygen content atomic percentage of $Ta_2O_5$ is the percentage of the total number of atoms occupied by oxygen atoms (O/(Ta+O)), and becomes 71.4 atm %. Therefore, an oxygen-deficient tantalum oxide has an oxygen content atomic percentage greater than 0 and less than 71.4 atm %. For example, when the metal included in a first metal oxide layer and the metal included in a second metal oxide layer are of the same type, the oxygen content atomic percentage is in a correspondence relation with the degree of oxygen deficiency. In other words, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

By adopting such a structure, when voltage is applied to the variable resistance element, most of the voltage is applied to the second variable resistance layer 106b which has low degree of oxygen deficiency and exhibits a higher resistance value. Furthermore, oxygen which can contribute to reaction is abundant in the vicinity of the interface between the upper electrode 107 and the second variable resistance layer 106b. Therefore, oxidation/reduction reaction occurs selectively at the interface between the upper electrode 107 and the second variable resistance layer 106b, and stable resistance change can be realized.

It should be noted that a different metal may be used for the metal included in the first metal oxide and the metal included in the second metal oxide. In this case, the second metal oxide may have a lower degree of oxygen deficiency, that is, a higher resistance, than the first metal oxide. By adopting such a configuration, more of the voltage applied between the lower electrode 105 and the upper electrode 107 at the time of resistance changing is distributed to the second metal oxide, and thus it is becomes possible to more easily cause the redox reaction occurring in the second metal oxide.

Furthermore, when a different metal is used for a first metal included in the first metal oxide forming the first variable resistance layer 106a and a second metal included in the second metal oxide forming the second variable resistance layer 106b, the standard electrode potential of the second metal may be lower than the standard electrode potential of the first metal. The standard electrode potential indicates a property in which resistance to oxidation is greater with a higher value. Accordingly, the occurrence of the redox reaction is facilitated in the second metal oxide having a relatively low standard electrode potential. It should be noted that, with regard to the resistance change phenomenon, it is thought that the resistance value (degree of oxygen deficiency) of the minute local region formed inside the second variable resistance layer 106b having a high resistance changes because a redox reaction occurs in the local region and the filament (conduction path) changes.

For example, by using an oxygen-deficient tantalum oxide ($TaO_x$) for the first metal oxide and using a titanium oxide ($TiO_2$) for the second metal oxide, stable resistance changing operation can be obtained. Titanium (standard electrode potential=−1.63 eV) is a material having a lower standard electrode potential than tantalum (standard electrode potential=−0.6 eV). In this manner, by using an oxide of a metal having a lower standard electrode potential than the first metal oxide for the second metal oxide, the redox reaction occurs more easily in the second metal oxide. As other combinations, an aluminum oxide ($Al_2O_3$) can be used for the second metal oxide that becomes a high resistance layer. For example, an oxygen-deficient tantalum oxide ($TaO_x$) may be used for the first metal oxide, and an aluminum oxide ($Al_2O_3$) can be used for the second metal oxide.

Furthermore, typically, $Ta_2O_5$ which has a stoichiometric composition is thought of as being an insulator, and thus the second variable resistance layer 106b comprising the second metal oxide obtained when oxygen is lost from $Ta_2O_5$ is an insulator. The definition of insulator in the present invention follows the typical definition. In other words, a material having a resistivity of $10^8$ Ωcm or higher is defined as an insulator (Non Patent Literature: adapted from "Semiconductor Engineering for Integrated Circuits" Engineering Investigation Committee (1992), Akira Usami, Shinnji Kanefusa, Takao Maekawa, Hajime Tomokage, Morio Inoue), and a material having a resistance value below $10^8$ Ωcm is defined as a conductor. In this case, although the resistivity of the second metal oxide is, for example, 4 to 6 digits different from that of the first metal oxide, the resistivity of the second variable resistance layer 106b, for example, changes to $10^4$ Ωcm due to the application of the break voltage.

It is thought that, for all the resistance change phenomena in the variable resistance layer 106 having the stacked structure of the respective materials described above, the resistance value of the minute local region formed inside the second metal oxide having a high resistance changes because a redox reaction occurs in the local region and the filament (conduction path) inside the local region changes.

Specifically, when a voltage that is positive with respect to the voltage of the lower electrode 105 is applied to the upper electrode 107 connected to the second metal oxide, the oxygen ions in the variable resistance layer 106 are pulled toward the second metal oxide-side. With this, a redox reaction occurs in the minute local region formed in the second metal oxide, and the degree of oxygen deficiency decreases. As a result, it is thought that it becomes difficult for the filament inside the local region to connect, and the resistance value of the local region increases.

Conversely, when a voltage that is negative with respect to the voltage of the lower electrode 105 is applied to the upper electrode 107 connected to the second metal oxide, the oxygen ions in the second metal oxide are pushed toward the first metal oxide-side. With this, a redox reaction occurs in the minute local region formed in the second metal oxide, and the degree of oxygen deficiency increases. As a result, it is thought that it becomes easy for the filament inside the local region to connect, and the resistance value of the local region decreases.

Of the lower electrode 105 and the upper electrode 107, the upper electrode 107 which is connected to the second variable resistance layer 106b having a lower degree of oxygen deficiency comprises a material, such as platinum (Pt), iridium (Ir), or palladium (Pd), which has a higher standard electrode potential compared to the metal included in the second metal oxide and the material comprised in the lower electrode. Furthermore, the lower electrode 105 connected to the first variable resistance layer 106a having a higher degree of oxygen deficiency may comprise a material, such as tungsten (W), nickel (Ni), tantalum (Ta), titanium (Ti), aluminum (Al), tantalum nitride (TaN), or titanium nitride (TiN), which has a lower standard electrode potential compared to the metal included in the first variable resistance layer 106a.

In other words, the standard electrode potential V2 of the upper electrode, the standard electrode potential Vr2 of the metal included in the second metal oxide, the standard electrode potential Vr1 of the metal included in the first metal oxide, and the standard electrode potential V1 of the lower electrode may satisfy a relationship in which Vr2<V2 and V1<V2. In addition, a relationship in which V2>Vr2 and Vr1≥V1 may be satisfied.

By adopting such a configuration, a redox reaction selectively occurs in the second variable resistance layer 106b, in the vicinity of the interface between the upper electrode 107 and the second variable resistance layer 106b, and thus a stable resistance change phenomenon occurs.

A single L-shaped step 106az (height: 1 to 30 nm, length 250 nm) including a single part that is curved (corner) and two parts that are straight (straight parts) such as that shown in (b) in FIG. 1 (b) is formed in the surface (the interface with the second variable resistance layer 106b) of the first variable resistance layer 106a. Therefore, the first variable resistance layer 106a is divided by the step 106az into a region 106ad having a thin film thickness and a lowered surface and a region 106au having a thick film thickness and a raised surface, that is, the region 106au showing the original film thickness. Therefore, it is possible to confirm the step 106az in the surface of the first variable resistance layer 106a in the cross-sectional view in FIG. 1 (a), and the surface of the first variable resistance layer 106a has a flat shape in the cross-sectional view in FIG. 2 (a). Although the shape of the corner of the step 106az is, for example, a right angle in order to make the break starting point fixed, since it is impossible to create a perfect right angle in terms of manufacturing methods, it is sufficient to form a corner having a changed curvature that is higher. A bend 106bz is created in the upper surface of the second variable resistance layer 106b formed above the step 106az. Therefore, when seen from above, the bend 106bz is formed in an L-shape including a single part that is curved (corner) and two parts that are straight (straight parts), in accordance with the step 106az. Although the shape of the corner of the bend 106bz is, for example, a right angle, since it is impossible to create a perfect right angle in terms of manufacturing methods, it is sufficient to form a corner having a changed curvature that is higher.

The step 106az is positioned between the first contact plug 104 and the second contact plug 110 (the first contact hole 103 and the second contact hole 109), and is a part which causes a change in elevation in the thickness direction of the first variable resistance layer 106a, in the interface between the first variable resistance layer 106a and the second variable resistance layer 106b. The first variable resistance layer 106a includes, as boundary planes with the second variable resistance layer 106b, a first principal plane (region 106au), a second principal plane (region 106ad) having a lower height than the first principal plane, and a side plane connecting the first principal plane and the second principal plane. In addition, the step 106az is configured from the side face of the first variable resistance layer 106a. This side plane is formed to have, for example, a 90 degree angle with respect to one or both of the first principal plane and the second principal plane.

The step 106az is a part which includes an inflection point at which the flatness changes abruptly in the interface between the first variable resistance layer 106a and the second variable resistance layer 106b, that is, a point at which the continuity of the flatness is interrupted. For example, the step 106az may be formed at the approximate center in the radial direction of the first contact hole 103 and the second contact hole 109.

The bend 106bz is positioned between the first contact plug 104 and the second contact plug 110 (the first contact hole 103 and the second contact hole 109), and is a part of the second variable resistance layer 106b which bends in the stacking direction of the second variable resistance layer 106b. The bend 106bz is provided along the step 106az, and is configured of a part above the side plane of the step 106az. For example, the bend 106bz may be formed at the approximate center in the radial direction of the first contact hole 103 and the second contact hole 109.

As described above, according to the configuration of the nonvolatile memory element 10 in Embodiment 1, the bend 106bz of the second variable resistance layer 106b is formed above the step 106az of the first variable resistance layer 106a, and thus it is possible to cause the initial break phenomenon even with a low voltage, with the bend 106bz as a starting point. "Break" refers to the localized short-circuiting of a part of the second variable resistance layer 106b having a low degree of oxygen deficiency and exhibiting insulating properties to form a filament and cause transition to a state where resistance change can start, when voltage is initially applied to the variable resistance element immediately after manufacturing.

Furthermore, since the shape of the step 106az is formed in an Intentional and controlled manner, the shape of the bend 106bz of the second variable resistance layer 106b is stable, and thus variation in break voltage and resistance change characteristics among elements can be suppressed.

Furthermore, since a filament is created within the variable resistance element with just a single corner of the bend 106az as a starting point, a filament can be formed in the vicinity of the center of the variable resistance element which is away from the edges of the variable resistance element. As a result, It becomes possible to reduce the impact of misalignment with the mask for forming the variable resistance element caused by miniaturization, and thus miniaturization and increased capacity of memories can be realized.

Furthermore, the lower electrode 105 is also formed in the part of the recess created above the first contact plug 104 inside the first contact hole 103, and is formed so that the surface of the lower electrode 105 is flat. Therefore, the shape and film thickness of the second variable resistance layer 106b at the bend 106bz is dependent only on the shape of the step 106az of the first variable resistance layer 106a, and is not affected by the shape of the base of a lower layer to the first variable resistance layer 106a. Therefore, it is possible to reduce variation in resistance change characteristics among bits caused by the base of the variable resistance layer 106.

[First Manufacturing Method]

Figure 4:
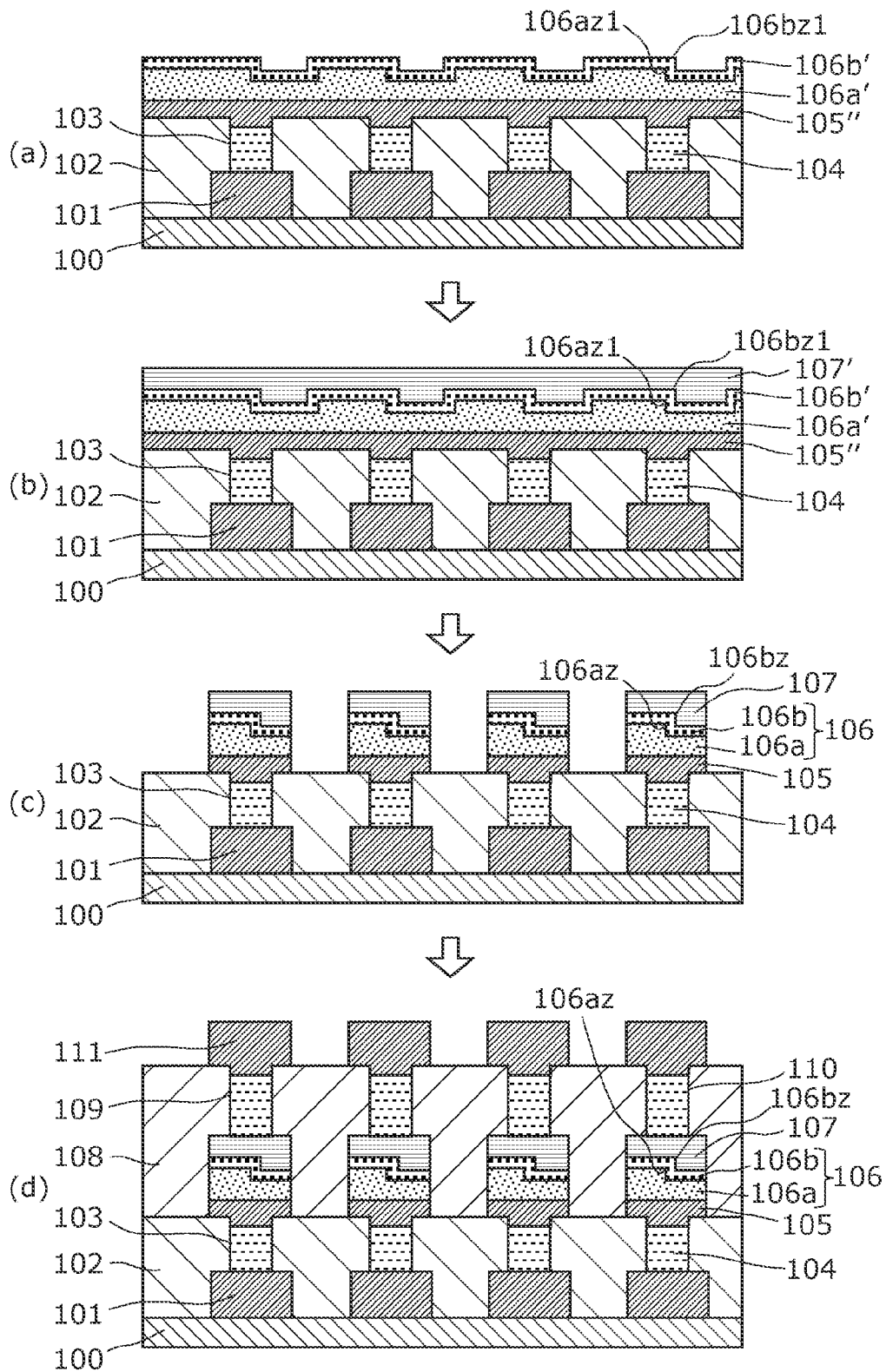
FIG. 4 shows, in (a) to (d), cross-sectional views illustrating the first manufacturing method for main parts of the nonvolatile memory element in Embodiment 1 of the present invention.

FIG. 3 (a) to (e) and FIG. 4 and (a) to (d) are cross-sectional views illustrating a first manufacturing method for main parts of the nonvolatile memory element 10 in Embodiment 1 of the present invention. Furthermore, FIG. 5 (a) to (e) are plan views illustrating the nonvolatile memory element 10 as seen from above, corresponding to the respective processes from FIG. 3 (d) to FIG. 4 (c). The first manufacturing method for the main parts of the nonvolatile memory element 10 in Embodiment 1 shall be described using these figures.

Figure 5:
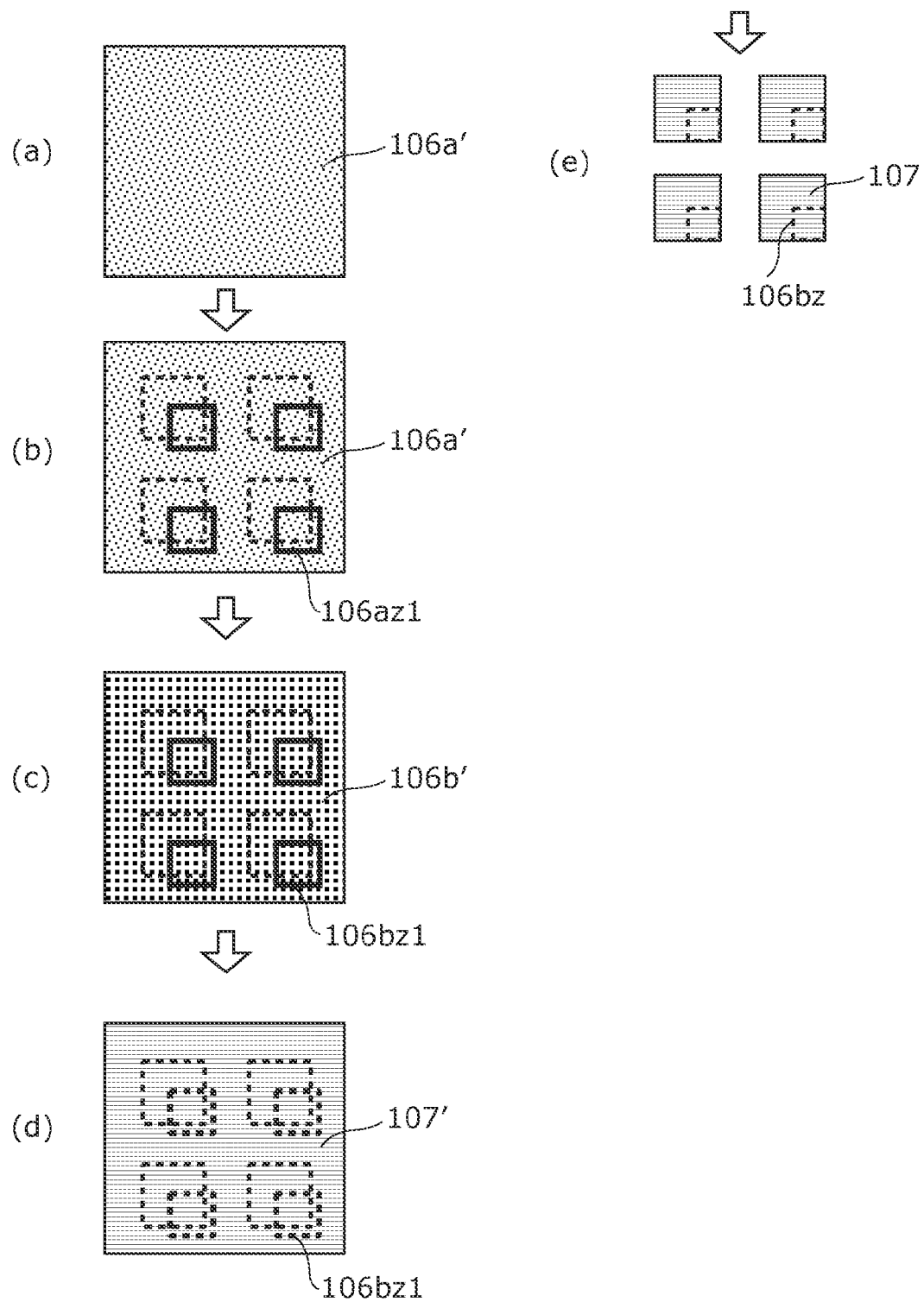
FIG. 5 shows, in (a) to (e), cross-sectional views illustrating the first manufacturing method for main parts of the nonvolatile memory element in Embodiment 1 of the present invention.

As shown from FIG. 3 to FIG. 5, the first method of manufacturing the first nonvolatile memory device 10 in this embodiment includes: forming the lower electrode 105 above the substrate 100; forming, above the lower electrode 105, the first variable resistance layer 106a comprising a first metal oxide and having a single step 106az in a surface; forming the second variable resistance layer 106b comprising a second metal oxide having a degree of oxygen deficiency that is lower than a degree of oxygen deficiency of the first metal oxide, to cover the step 106az of the first variable resistance layer 106a and have, above the step 106az, a bend 106bz that covers the step 106az; and forming the upper electrode 107 above the second variable resistance layer 106b, wherein in the forming of the first variable resistance layer 106a, the step 106az is formed so that, as seen from above, the step 106az has only one corner in the surface of the first variable resistance layer 106a. Stated differently, the bend 106bz is formed in such a way that, when seen from above, the bend 106bz has only one corner in the surface of the second variable resistance layer 106b.

Here, in the process of forming the first variable resistance layer 106, the step 106az is formed in such a way that, when seen from above, the corner of the step 106az is located at the center in the surface of the first variable resistance layer 106a.

The first manufacturing method of the nonvolatile memory element 10 in Embodiment 1 shall be described in detail below.

First, as shown in FIG. 3 (a), the following are formed: the substrate 100 on which the first. The 101; the first interlayer insulating layer 102 comprising a silicon oxide film (film thickness: 500 to 1000 nm) formed on the substrate 100 and covering the first line 101; and the first contact plug 104 which has tungsten (W) as a primary component and is formed by being filled into the first contact hole 103 (diameter: 50 to 300 nm) which penetrates through the first interlayer insulating layer 102 and reaches the first. The 101. The top plane of the first contact plug 104 and the top plane of the first interlayer insulating layer 102 are not continuous (i.e., not coplanar), and a recess (depth: 5 to 50 nm) is created in the non-continuous part. A plasma TEOS film can be used for the first interlayer insulating layer 102. Furthermore, in order to reduce the amount of parasitic capacitance between lines, a fluorine-containing oxide (for example, FSG) or a low-k material, and so on can be used for the first interlayer insulating layer 102.

Next, as shown in FIG. 3 (b), in a process of forming a conductive layer 105' (the lower electrode 105), the conductive layer 105' (film thickness: 50 to 200 nm) comprising a tantalum nitride and which later becomes the lower electrode 105 is formed with the sputtering method, on the first interlayer insulating layer 102 and covering the first contact plug 104. The conductive layer 105' is also formed in the part of the recess created above the first contact plug 104 inside the first contact hole 103. Furthermore, a depression reflecting the shape of the base is created in the top plane of the conductive layer 105' on the first contact plug 104.

Next, as shown in FIG. 3 (c), in a process of forming a conductive layer 105" (the lower electrode 105), planarization polishing using the chemical mechanical polishing method (CMP method) is performed on the entire surface of the wafer to form the conductive layer 105" (film thickness: 20 to 100 nm) which becomes the lower electrode 105 after patterning. The point of this process is to perform planarization polishing on the conductive layer 105' until the above-described depression in the conductive layer 105' created in FIG. 3 (b) disappears, and to leave behind the entire conductive layer 105". According to such a manufacturing method, the step created above the first contact plug 104 is not transferred onto the surface of the conductive layer 105", and thus the lower electrode 105 is extremely flat throughout the entire surface, and a continuous plane is maintained above the first contact plug 104 and the first interlayer insulating layer 102. This is because, unlike when the first contact plug 104 is formed, what is polished is always the same type of material because the polishing of the conductive layer 105" is stopped along the way, and thus, in principle, the difference in polishing rates in the CMP method can be avoided.

Next, as shown in FIG. 3 (d) and FIG. 5 (a), in a process of forming a first variable resistance layer 106a', the first variable resistance layer 106a' comprising a first metal oxide is formed on the conductive layer 105". Here, the first variable resistance layer 106a' is formed using what is called a reactive sputtering method in which sputtering is performed on a tantalum target in an argon (Ar) and oxygen gas atmosphere. The oxygen content atomic percentage of the first variable resistance layer 106a' is 40 to 65 atm %, the resistivity is 0.2 to 50 mΩcm, and the film thickness is 20 to 100 nm.

Next, as shown in FIG. 3 (e) and FIG. 5 (b), in a process of forming a step 106az1 which later becomes the step 106az in the first variable resistance layer 106a', the rectangular-shaped (ring-shaped) step 106az1 (height: 1 to 30 nm) having a different corner in each of plural variable resistance elements is formed by etching using a desired mask. It should be noted that, in FIG. 5, a variable resistance element (variable resistance layer 106) formed in a later process is shown using dotted lines. Moreover, although an example is described here in which the region inside the black solid line in FIG. 5 (b) is etched using a mask and becomes a depression, conversely, the region outside the black solid line may be etched to become a depression.

At this time, one of the corners of the rectangle-shape is disposed so as to be included in a variable resistance element, and such corner is, for example, disposed in the vicinity of the center of the variable resistance element. With this, a filament can be formed in the vicinity of the center of the variable resistance element which is away from the edges of the variable resistance element, and thus it is possible to reduce the effects of misalignment with a mask and etching damage in the formation of the variable resistance element caused by miniaturization.

Furthermore, when forming the step 106az1, that etching may be performed using an inert gas such as Ar, or the like, as the etching gas in order to prevent fluorine (F), and so on, included in the etching gas from entering the first variable resistance layer 106a' and causing etching damage which causes the film property of the variable resistance layer to deteriorate. Furthermore, wet etching may be performed using an etching liquid containing hydrofluoric acid (HF) and so on. In this case, the fluorine (F) included in the etching liquid does not enter the variable resistance layer, and therefore does not cause the variable resistance layer to deteriorate.

Next, as shown in FIG. 4 (a) and FIG. 5 (c), in a process of forming a second variable resistance layer 106b', the second variable resistance layer 106b' comprising a second metal oxide having a degree of oxygen deficiency lower than the degree of oxygen deficiency of the first metal oxide (first variable resistance layer 106a') is formed on the first variable resistance layer 106a' and covering the step 106az1 of the first variable resistance layer 106a'. In the same manner as in the first variable resistance layer 106a', the second variable resistance layer 106b' is formed with the reactive sputtering method of performing sputtering on a tantalum target in an oxygen gas atmosphere. The oxygen content atomic percentage of the second variable resistance layer 106b' is 67 to 71 atm %, the resistivity is $10^7$ mΩcm or greater, and the film thickness is 2 to 10 nm. A bend 106bz1 which later becomes the bend 106bz is formed above the step 106az1 in the surface of the first variable resistance layer 106a'. Here, the film thickness (film thickness on the side wall of the step 106az1) of the bend 106bz1 of the second variable resistance layer 106b' can be adjusted to be thin according to the height of the step 106az1 base, and a thin-film part can be formed locally in a stable manner. Furthermore, compared to the flat part of the second variable resistance layer 106b', the film property tends to become sparse in the bend 106bz1 of the second variable resistance layer 106b', and thus a film that allows easy breaking can be realized. Although the second variable resistance layer 106b' is formed using reactive sputtering in the above-described process, a reactive sputtering method in which sputtering is performed on a tantalum oxide target in an oxygen gas atmosphere may be used, and the second variable resistance layer 106b' may be formed using plasma oxidation in an atmosphere which includes oxygen.

Next, as shown in FIG. 4 (b) and FIG. 5 (d), in a process of forming a conductive layer 107' (the upper electrode 107), the conductive layer 107' comprising a noble metal (platinum, iridium, palladium, and so on) which becomes the upper electrode 107 after patterning is formed on the second variable resistance layer 106b'.

Next, as shown in FIG. 4 (c) and FIG. 5 (e), in a process of forming the variable resistance element, patterning using the desired mask is performed on the conductive layer 105", the first variable resistance layer 106a', the second variable resistance layer 106b', and the conductive layer 107' shown in FIG. 4 (b) to form the variable resistance element in which the variable resistance layer 106 configured of the stacked layers of the first variable resistance layer 106a and the second variable resistance layer 106b is held between the lower electrode 105 and the upper electrode 107. At this time, the step 106az and the bend 106bz are also formed at the same time.

It should be noted that, since etching is difficult to perform on a noble metal and the like which is typified as a material having high standard electrode potential, when such a material is used for the upper electrode 107, the variable resistance element can also be formed with such upper electrode 107 as a hard mask. Although, in the present process, patterning is performed collectively on the respective layers of the variable resistance element using the same mask, patterning may be performed on a per layer basis.

Lastly, as shown in FIG. 4 (d), the second interlayer insulating layer 108 (film thickness: 500 to 1000 nm) is formed covering the variable resistance element, and the second contact hole 109 and the second contact plug 110 are formed according to the same manufacturing method as that for the first contact hole 103 and the first contact plug 104. Subsequently, the second line 111 is formed covering the second contact plug 110, and the nonvolatile memory element 10 is completed. Stated differently, the nonvolatile memory device in FIG. 4 (d) including plural nonvolatile memory elements 10 is completed. In the nonvolatile memory device, among the respective nonvolatile memory elements 10 (four in FIG. 5 (e)), the relative positional relationship between the one corner of the bend 106bz and the two straight parts making up the one corner as seen from above is the same. Therefore, the orientation of the corner of the bend 106bz of one of the variable resistance elements as seen from above is the same as the orientation of the bend 106bz of the other variable resistance elements as seen from above. For example, as shown in FIG. 5 (e), the orientation of the corner of the respective bends 106bz of the four adjacent variable resistance elements is towards the upper left.

As described above, according to the first manufacturing method in Embodiment 1, it is possible to reflect the shape of the step of the surface of the first variable resistance layer 106a and thereby stably form the bend 106bz in the second variable resistance layer 106b above the step 106az, and thus it is possible to cause the break phenomenon even with a low voltage, with the bend 106bz as a starting point.

Furthermore, since the shape of the step can be formed in an intentional and controlled manner, the shape of the bend 106bz of the second variable resistance layer 106b is stable, and thus variation in initial break voltage and resistance change characteristics among elements can be suppressed.

Furthermore, since a filament is created within the variable resistance element with just a single corner of the bend 106az as a starting point, a filament can be formed in the vicinity of the center of the variable resistance element which is away from the edges of the variable resistance element.

Furthermore, since the single step 106az is formed by performing a masking process only once, it is possible to reduce the effects of misalignment with a mask for the formation of the variable resistance element caused by miniaturization, and miniaturization and increased capacity of memories can be realized.

It should be noted that, in the process of forming the step 106az1 shown in FIG. 3 (e) and FIG. 5 (b), the step 106az1 is formed in such a way that the distance between adjacent steps 106az1 of the first variable resistance layer 106a' before patterning (i.e., one side of the opening of the mask) as seen from above is less than the smallest dimension of the first variable resistance layer 106a after patterning as seen from above. However, the step 106az1 may be formed in such a way that the distance between adjacent steps 106az1 of the first variable resistance layer 106a' before patterning (i.e., one side of the opening of the mask) as seen from above is greater than the smallest dimension of the first variable resistance layer 106a after patterning as seen from above.

In this case, the smallest dimension of the step 106az1 is the length of the shortest side when the step 106az1 of the first variable resistance layer 106a' before patterning (the shape of the opening of the mask pattern for forming the step 106az1)

as seen from above is of a polygonal shape, and is the length of the smallest diameter when the step 106az1 is of an elliptical shape or circular shape. In the same manner, the smallest dimension of the first variable resistance layer 106a is the length of the shortest side when the first variable resistance layer 106a after patterning as seen from above is of a polygonal shape, and is the length of the smallest diameter when such first variable resistance layer 106a is of an elliptical shape or circular shape. The same applies hereinafter.

It should be noted that, in the above-described process, in the process of forming the variable resistance element, after depositing the conductive layer 105", the first variable resistance layer 106a', the second variable resistance layer 106b', and the conductive layer 107', patterning is performed collectively on the respective layers using the desired mask, to thereby form the variable resistance element in which the variable resistance layer 106 configured of the stacked layers of the first variable resistance layer 106a and the second variable resistance layer 106b is held between the lower electrode 105 and the upper electrode 107.

However, the variable resistance element may be formed by patterning an individual layer each time one of the respective layers described above is formed. In other words, in the process of forming the lower electrode 105, the lower electrode 105 is formed by patterning the conductive layer 105" after the conductive layer 105" is formed. Subsequently, in the process of forming the first variable resistance layer 106a, after the first variable resistance layer 106a' is formed, the step 106az1 is formed in the surface of the formed first variable resistance layer 106a', and patterning is performed on the first variable resistance layer 106a' in which the step 106az1 is formed, to thereby form the first variable resistance layer 106a having the single step 106az in the surface. Then, in the process of forming the second variable resistance layer 106b, after the second variable resistance layer 106b' is formed, patterning is performed on the formed second variable resistance layer 106b' to thereby form the second variable resistance layer 106b. Subsequently, in the process of forming the upper electrode 107, after the conductive layer 107' is formed, patterning is performed on the formed conductive layer 107' to thereby form the upper electrode 107. Thus, the variable resistance element may be formed through a process such as that described above.

[Second Manufacturing Method]

Figure 6:
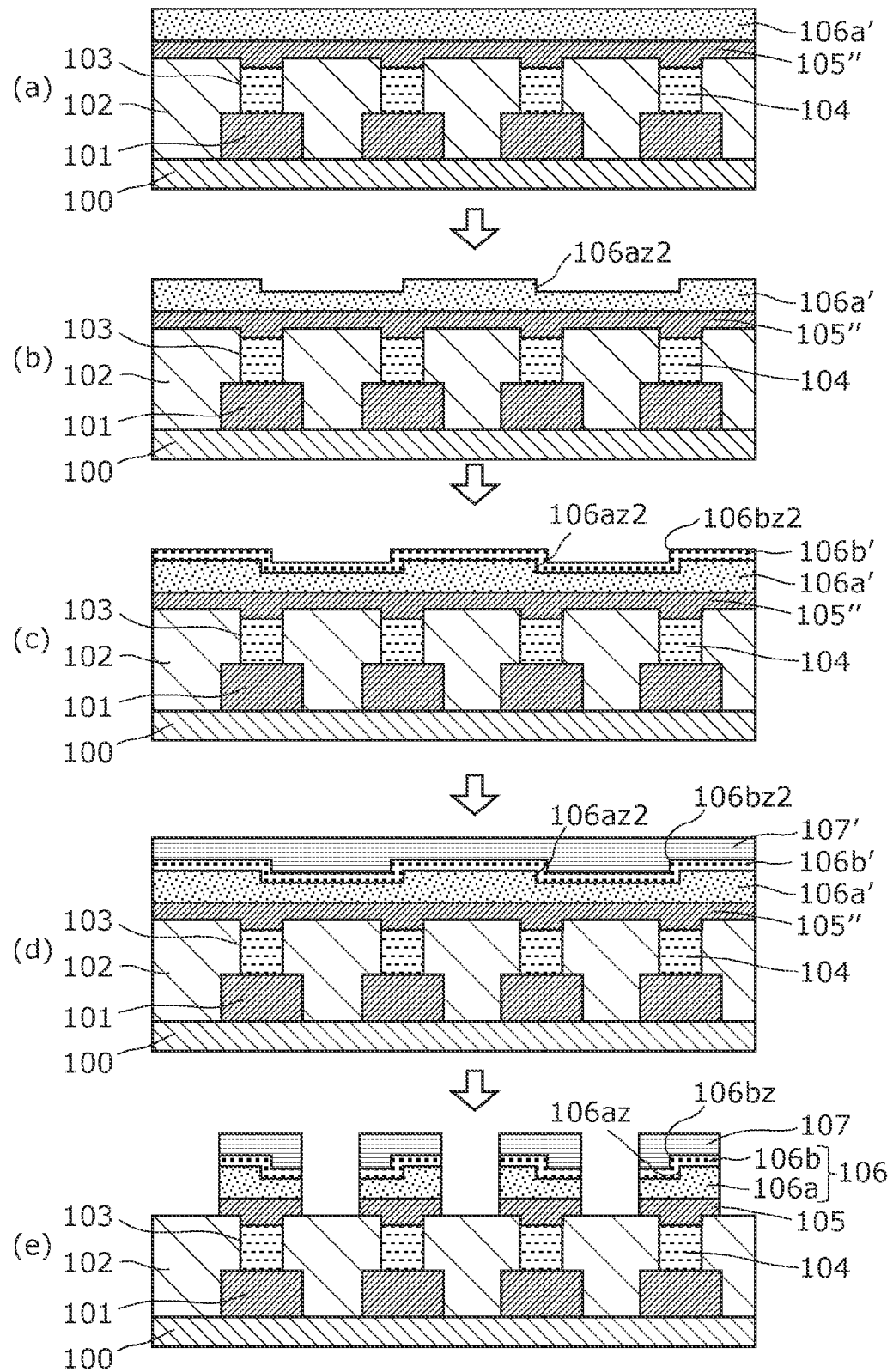
FIG. 6 shows, in (a) to (e), cross-sectional views illustrating a second manufacturing method for main parts of the nonvolatile memory element in Embodiment 1 of the present invention.

FIG. 6 (a) to (e) are cross-sectional views illustrating a second manufacturing method for main parts of the nonvolatile memory element 10 in Embodiment 1 of the present invention. Furthermore, FIG. 7 (a) to (e) are plan views illustrating the nonvolatile memory element 10 as seen from above, corresponding to the respective processes from FIG. 6 (a) to FIG. 6 (e). The second manufacturing method for the main parts of the nonvolatile memory element 10 in Embodiment 1 shall be described using these figures. It should be noted that processes prior to those in FIG. 6 (a) are the same as those in FIG. 3 (a) to (c), and thus description thereof shall not be repeated below.

Figure 7:
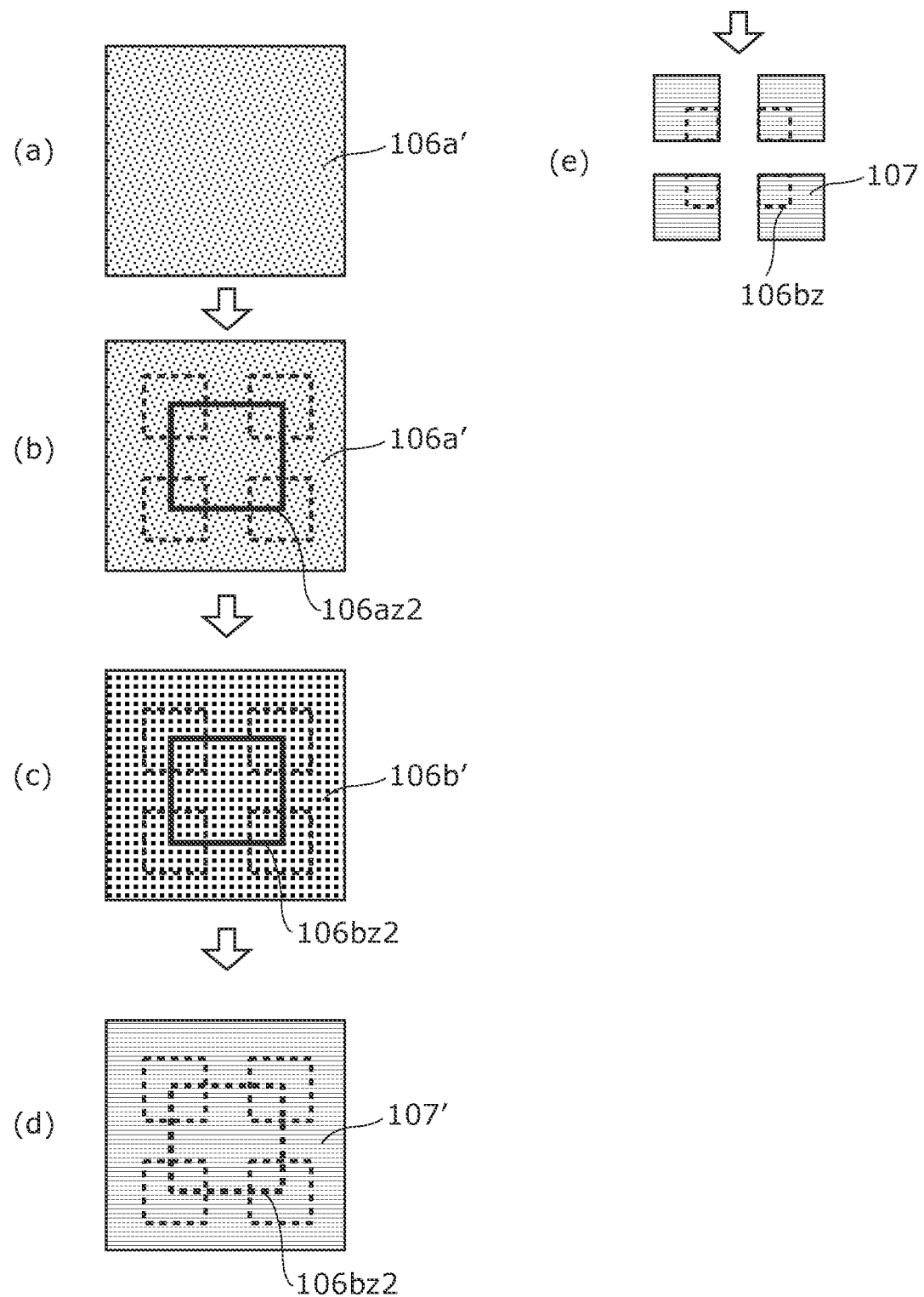
FIG. 7 shows, in (a) to (e), cross-sectional views illustrating the second manufacturing method for main parts of the nonvolatile memory element in Embodiment 1 of the present invention.

As shown in FIG. 6 and FIG. 7, the second method of manufacturing the nonvolatile memory element 101n this embodiment is different from the first method of manufacturing in that: in the forming of the first variable resistance layer 106a, the first variable resistance layer 106a having the single step 106az in the surface is formed by forming the first variable resistance layer 106a', forming the step 106az2 in the surface of the formed first variable resistance layer 106a', and patterning the first variable resistance layer 106a' in which the step 106az2 has been formed, and in the forming of the first variable resistance layer 106a, the step 106az2 is formed so that the distance (smallest dimension) between adjacent steps 106az2 of the first variable resistance layer 106a' before patterning on which the step 106az2 has been formed as seen from above is greater than the smallest dimension of the first variable resistance layer 106a after patterning as seen from above.

A method of manufacturing a nonvolatile memory device including a plurality of the nonvolatile memory elements 10, using the second method of manufacturing the nonvolatile memory element 10, includes: in the forming of the first variable resistance layer 106a, separating the single first variable resistance layer 106a' into a plurality of the first variable resistance layers 106 corresponding to the nonvolatile memory elements 10 through the patterning; and in the forming of a first variable resistance layer 106a, forming the step az2 so that the single step 106az2 of the first variable resistance layer 106a' before the patterning in which the step 106az2 has been formed, as seen from above, extends across the first variable resistance elements 106a after the patterning.

The second manufacturing method of the nonvolatile memory element 10 in Embodiment 1 shall be described in detail below.

First, as shown in FIG. 6 (a) and FIG. 7 (a), in the process of forming the first variable resistance layer 106a', the first variable resistance layer 106a' comprising the first metal oxide is formed on the conductive layer 105". Here, the first variable resistance layer 106a' is formed using what is called a reactive sputtering method in which sputtering is performed on a tantalum target in an argon (Ar) and oxygen gas atmosphere. The oxygen content atomic percentage of the first variable resistance layer 106a' is 40 to 65 atm %, the resistivity is 0.2 to 50 mΩcm, and the film thickness is 20 to 100 nm.

Next, as shown in FIG. 6 (b) and FIG. 7 (b), in a process of forming a step 106az2 which later becomes the step 106az in the first variable resistance layer 106a', the rectangular-shaped step 106az2 (height: 1 to 30 nm) having four corners across plural variable resistance elements is formed by etching using a desired mask. It should be noted that, in FIG. 7, a variable resistance element (variable resistance layer 106) formed in a later process is shown using dotted lines. Moreover, although an example is described herein which the region inside the black solid line in FIG. 7 (b) is etched using a mask and becomes a depression, conversely, the region outside the black solid line may be etched to become a depression.

At this time, each of the corners of the rectangular shape is disposed so as to be included in a different one of the four adjacent variable resistance elements, and the corner is, for example, disposed in the vicinity of the center of the corresponding variable resistance element. With this, a filament can be formed in the vicinity of the center of the variable resistance element which is away from the edges of the variable resistance element, and thus it is possible to reduce the effects of misalignment with a mask and etching damage in the formation of the variable resistance element caused by miniaturization. In addition, the need to form the rectangular step pattern to be planarly smaller than the variable resistance element is eliminated, and thus the problem of miniaturization being limited by the rectangular-shaped step pattern can also be solved.

Next, as shown in FIG. 6 (c) and FIG. 7 (c), in the process of forming the second variable resistance layer 106b', the second variable resistance layer 106b' comprising the second metal oxide having a degree of oxygen deficiency lower than the degree of oxygen deficiency of the first metal oxide (the first variable resistance layer 106a') is formed on the first variable resistance layer 106a' and covering the step 106az2 of the first variable resistance layer 106'. In the same manner as in the first variable resistance layer 106a', the second variable resistance layer 106b' is formed with the reactive sputtering method of performing sputtering on a tantalum target in an oxygen gas atmosphere. The oxygen content atomic percentage of the second variable resistance layer 106b' is 67 to 71 atm %, the resistivity is $10^7$ mΩcm or greater, and the film thickness is 2 to 10 nm. A bend 106bz2 which later becomes the bend 106bz is formed above the step 106az2 in the surface of the first variable resistance layer 106a'. Here, the film thickness (film thickness on the side wall of the step 106az1) of the bend 106bz2 of the second variable resistance layer 106b' can be adjusted to be thin according to the height of the step 106az2 base, and a thin-film part can be formed locally in a stable manner. Furthermore, compared to the flat part of the second variable resistance layer 106b', the film property tends to become sparse in the bend 106bz2 of the second variable resistance layer 106b', and thus a film that allows easy breaking can be realized. Although the second variable resistance layer 106b' is formed using reactive sputtering in the above-described process, a reactive sputtering method in which sputtering is performed on a tantalum oxide target in an oxygen gas atmosphere may be used, and the second variable resistance layer 106b' may be formed using plasma oxidation in an atmosphere which includes oxygen.

Next, as shown in FIG. 6 (d) and FIG. 7 (d), in the process of forming the conductive layer 107' (the upper electrode 107), the conductive layer 107' comprising a noble metal (platinum, iridium, palladium, and so on) which becomes the upper electrode 107 after patterning is formed on the second variable resistance layer 106b'.

Next, as shown in FIG. 6 (e) and FIG. 7 (e), in the process of forming the variable resistance element, patterning using the desired mask is performed on the conductive layer 105", the first variable resistance layer 106a', the second variable resistance layer 106b', and the conductive layer 107' shown in FIG. 6 (a) to form the variable resistance element in which the variable resistance layer 106 configured of the stacked layers of the first variable resistance layer 106a and the second variable resistance layer 106b is held between the lower electrode 105 and the upper electrode 107. At this time, the step 106az and the bend 106bz are also formed at the same time.

It should be noted that, since etching is difficult to perform on a noble metal and the like which is typified as a material having high standard electrode potential, when such a material is used for the upper electrode 107, the variable resistance element can also be formed with such upper electrode 107 as a hard mask. Although, in the present process, patterning is performed collectively on the respective layers of the variable resistance element using the same mask, patterning may be performed on a per layer basis. Furthermore, the difference with the first manufacturing method is that the orientation of the step 106az of the first variable resistance layer 106a is reversed in an adjacent variable resistance element.

With regard to the subsequent processes, the nonvolatile memory element 10 is completed through the same method as in FIG. 4 (d). Stated differently, a nonvolatile memory device including plural nonvolatile memory elements 10 is completed. In the nonvolatile memory device, among the respective nonvolatile memory elements 10 (four in FIG. 7 (e)), the relative positional relationship between the one corner of the bend 106bz and the two straight parts making up the one corner as seen from above is different. Therefore, the orientation of the corner of the bend 106bz of one of the variable resistance elements as seen from above is different from the orientation of the bend 106bz of the other variable resistance elements as seen from above. For example, as shown in FIG. 7 (e), the orientations of the corners of the respective bends 106bz of the four adjacent variable resistance elements are: the top left for the top left variable resistance element; the top right for the top right variable resistance element; the bottom left for the bottom left variable resistance element; and the bottom right for the bottom right variable resistance element. In other words, the orientations of the four corners are all different.

As described above, according to the second manufacturing method in Embodiment 1, it is possible to reflect the shape of the step of the surface of the first variable resistance layer 106a and thereby stably form the bend 106bz in the second variable resistance layer 106b on the step 106az, and thus it is possible to cause the break phenomenon even with a low voltage, with the bend 106bz as a starting point.

Furthermore, since the shape of the step can be formed in an intentional and controlled manner, the shape of the bend 106bz of the second variable resistance layer 106b is stable, and thus variation in initial break voltage and resistance change characteristics among elements can be suppressed.

Furthermore, since a filament is created within the variable resistance element with just a single corner of the bend 106az as a starting point, a filament can be formed in the vicinity of the center of the variable resistance element which is away from the edges of the variable resistance element.

Furthermore, since the single step 106az is formed by performing a masking process only once, it is possible to reduce the effects of misalignment with a mask for the formation of the variable resistance element caused by miniaturization, and miniaturization and increased capacity of memories can be realized.

Furthermore, compared to the first manufacturing method, the need to form the rectangular step pattern to be planarly smaller than the variable resistance element is eliminated, and thus the problem of miniaturization being limited by the rectangular-shaped step pattern can be solved.

It should be noted that, in the second manufacturing method in Embodiment 1, the steps 106az of four variable resistance elements, that is, four bends 106bz are formed at the same time, and thus the rectangular-shaped step 106az2 having four corners is formed. However, when the steps 106az, that is, the bends 106bz, of two variable resistance elements are to be formed at the same time, it is sufficient that a step 106az2 having two corners is formed.

It should be noted that, in the same manner as in the first manufacturing method according to Embodiment 1 described earlier, even in the second manufacturing method, the variable resistance element may be formed by patterning an individual layer each time one of the layers of the conductive layer 105", the first variable resistance layer 106a', the second variable resistance layer 106b', and the conductive layer 107' is formed.

Embodiment 2

[Element Configuration]

FIG. 8 (a) is a cross-sectional view (cross-sectional view at A-A' in FIG. 8 (b)) of an exemplary configuration of a nonvolatile memory element 20 in Embodiment 2 of the present invention, and FIG. 8 (b) is a plan view of the surface of the lower electrode 105 in FIG. 8 (a). Furthermore, FIG. 9 (a) is a cross-sectional view (cross-sectional view at B-B' in FIG. 9 (b)) of an exemplary configuration of the nonvolatile memory element 20 in Embodiment 2 of the present invention, and FIG. 9 (b) is a plan view of the lower electrode 105 in FIG. 9

(*a*). It should be noted that FIG. 8 (*a*) and FIG. 9 (*a*) show cross-sectional views at different positions of the same nonvolatile memory element 20.

As shown in FIG. 8 and FIG. 9, the nonvolatile memory element 20 in Embodiment 2 includes: a substrate 100; the lower electrode 105 formed above the substrate 100; the second variable resistance layer 106*b* formed on the lower electrode 105 and comprising a second metal oxide; the first variable resistance layer 106*a* formed on the second variable resistance layer 106*b* and comprising a first metal oxide having a degree of oxygen deficiency higher than the degree of oxygen deficiency of the second metal oxide; and the upper electrode 107 formed on the first variable resistance layer 106*a*. There is a single step 105*s* in the interface between the lower electrode 105 and the second variable resistance layer 106*b*. The second variable resistance layer 106*b* is formed covering the step 105*s* and includes, above the step 105*s*, a bend 106*bs* covering the step 105*s*. As seen from above, the bend 106*bs* has only one corner in the surface of the second variable resistance layer 106*b*.

Here, the corner of the bend 106*bs* as seen from above is located at the center, in the surface of the second variable resistance layer 106*b*. Moreover, the second variable resistance film 106*b* is an insulating layer. In addition, the first metal oxide and the second metal oxide comprise an oxide of tantalum, hafnium, or zirconium.

It should be noted that although the corner of the bend 106*bs* is located at the center in the surface of the second variable resistance layer 106*b*, this center refers to the median point in the case where the second variable resistance layer 106*b* has a polygonal shape or elliptical shape when seen from above. Furthermore, this center does not mean the precise center, but an approximate center that includes positions displaced within the range of manufacturing variations.

The nonvolatile memory element 20 in Embodiment 2 shall be described in detail below.

As shown in FIG. 8 and FIG. 9, the difference between the nonvolatile memory element 20 in Embodiment 2 and the nonvolatile memory element 10 in Embodiment 1 is in the structure in which the first variable resistance layer 106*a* and the second variable resistance layer 106*b* are in a vertically-reversed placement. Therefore, whereas the bend 106*bz* of the second variable resistance layer 106*b* is formed above the step 106*az* formed in the surface of the first variable resistance layer 106*a* in the nonvolatile memory element 10, in the nonvolatile memory element 20, the single L-shaped step 105*s* including a single corner and two straight lines is formed in the surface of the lower electrode 105 (the interface with the second variable resistance layer 106*b*), and the lower electrode 105 is divided by the step 105*s* into a region 105*d* having a thinner film thickness and lower surface and a region 105*u* having a thicker film thickness and a higher surface, that is, a region 105*u* showing the original film thickness. As such, the step 105*s* can be recognized in the surface of the lower electrode 105 in the cross-sectional view in FIG. 8 (*a*), and the surface of the lower electrode 105 assumes a flat shape in the cross-sectional view in FIG. 9 (*a*). Although the shape of the corner of the step 105*s* is, for example, a right angle in order to make the break starting point fixed, since it is impossible to create a perfect right angle in terms of manufacturing methods, it is sufficient to form a corner having a higher curvature. A bend 106*bs* is created in the surface of the second variable resistance layer 106*b* formed on the step 105*s*, which is above the step 105*s*. Therefore, when seen from above, the bend 106*bs* is formed in an L-shape including a single corner and two straight parts, in accordance with the step 105*s*.

The step 105*s* is positioned between the first contact plug 104 and the second contact plug 110 (the first contact hole 103 and the second contact hole 109), and is a part which causes a change in elevation in the interface between the second variable resistance layer 106*b* and the lower electrode 105. The step 105*s* is configured of the side plane connecting a first principal plane and a second principal plane lower than the first principal plane which serve as boundary planes between the second variable resistance layer 106*b* and the lower electrode 105. This side plane is formed to have, for example, a 90 degree angle with respect to one or both of the first principal plane and the second principal plane.

The step 105*s* is the part which includes an inflection point at which the flatness changes abruptly, that is, a point at which the continuity of the flatness is interrupted, in the interface between the second variable resistance layer 106*a* and the lower electrode 105. For example, the bend 105*s* may be formed at the approximate center in the radial direction of the first contact hole 103 and the second contact hole 109.

The bend 106*bs* is positioned between the first contact plug 104 and the second contact plug 110 (the first contact hole 103 and the second contact hole 109), and is a part of the second variable resistance layer 106*b* which bends in the stacking direction of the second variable resistance layer 106*b*. The bend 106*bs* is provided along the step 105*s*, and configured of a part above the side plane of the step 105*s*. For example, the bend 106*bs* may be formed at the approximate center in the radial direction of the first contact hole 103 and the second contact hole 109.

As described above, according to the configuration of the second nonvolatile memory element 20 in Embodiment 2, the bend 106*bs* of the second variable resistance layer 106*b* is formed above the step 105*s* of the lower electrode 105, and thus it is possible to cause the break phenomenon even with a low voltage, with the bend 106*bs* as a starting point.

Furthermore, since the shape of the step 105*s* is formed in an intentional and controlled manner, the shape of the bend 106*bs* of the second variable resistance layer 106*b* is stable, and thus variation in initial break voltage and resistance change characteristics among elements can be suppressed.

Furthermore, since a filament is created within the variable resistance element with just a single corner of the step 105*s* as a starting point, a filament can be formed in the vicinity of the center of the variable resistance element which is away from the edges of the variable resistance element. As a result, it becomes possible to reduce the impact of misalignment with the mask for forming the variable resistance element caused by miniaturization, and thus miniaturization and increased capacity of memories can be realized.

[First Manufacturing Method]

Figure 10:
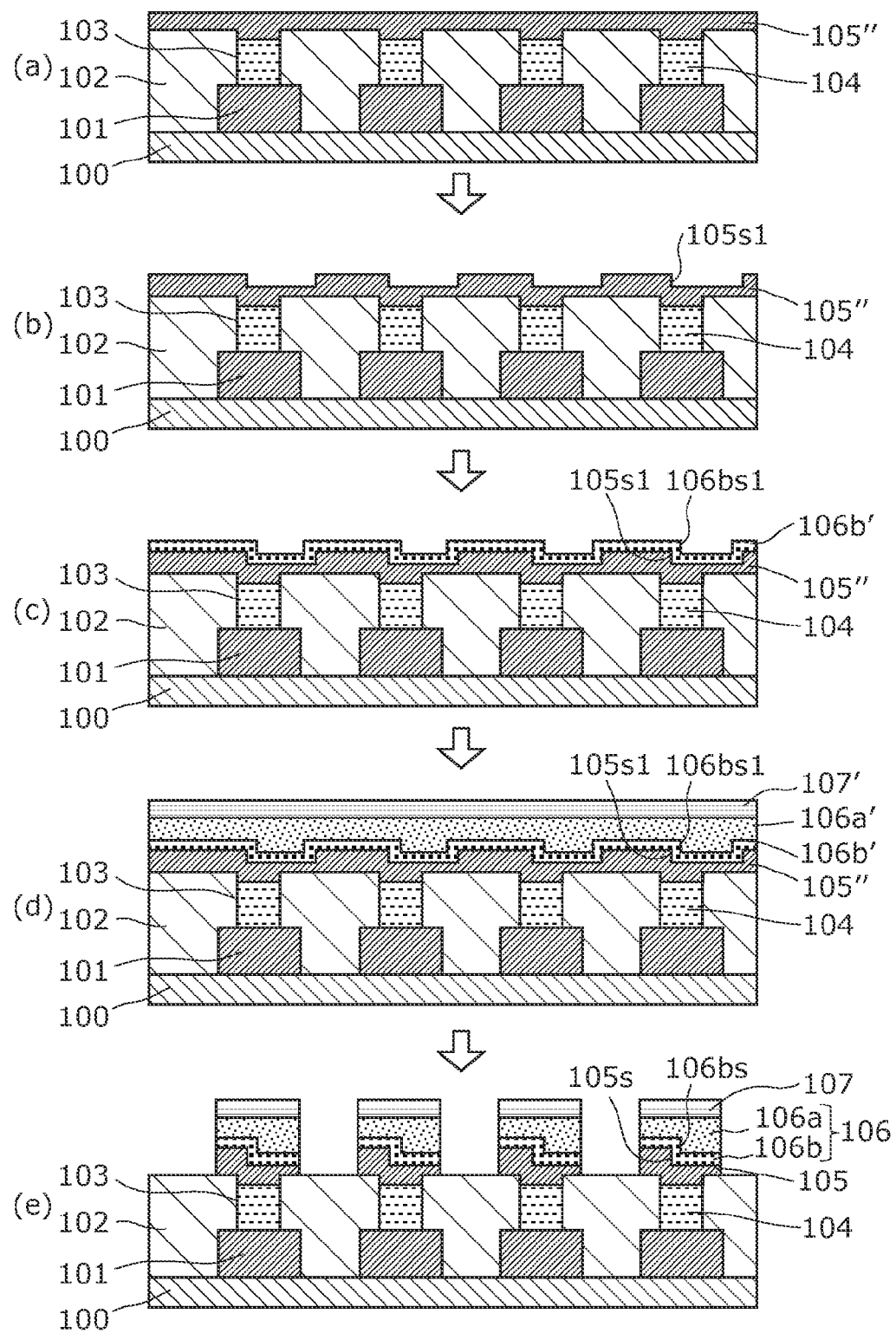
FIG. 10 shows, in (a) to (e), cross-sectional views illustrating a first manufacturing method for main parts of the nonvolatile memory element in Embodiment 2 of the present invention.

FIG. 10 (*a*) to (*e*) are cross-sectional views illustrating a first manufacturing method for main parts of the nonvolatile memory element 20 in Embodiment 2 of the present invention. Furthermore, FIG. 11 (*a*) to (*f*) are plan views illustrating the nonvolatile memory element 20 as seen from above, corresponding to the respective processes from FIG. 10 (*a*) to (*e*). The first manufacturing method for the main parts of the nonvolatile memory element 20 in Embodiment 2 shall be described using these figures. Furthermore, processes prior to FIG. 10 (*a*) are the same as those in FIG. 3 (*a*) to (*b*), and thus description thereof shall not be repeated below.

Figure 11:
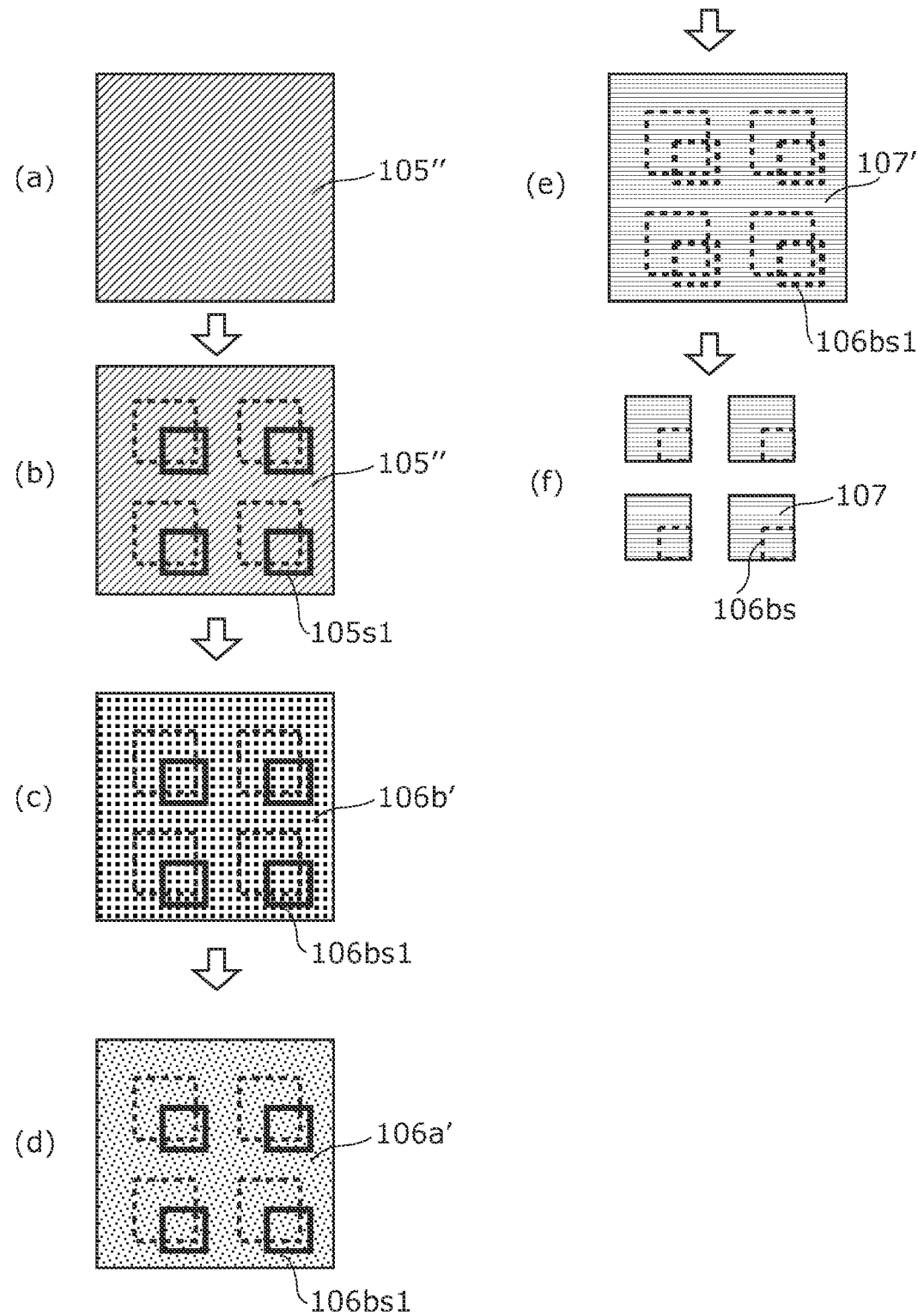
FIG. 11 shows, in (a) to (f), cross-sectional views illustrating the first manufacturing method for main parts of the nonvolatile memory element in Embodiment 2 of the present invention.

As shown in FIG. 10 and FIG. 11, the first method of manufacturing the nonvolatile memory element 20 in Embodiment 2 includes: forming the lower electrode 105 having a single step 105*s* in a surface, above the substrate 100; forming the second variable resistance layer 106*b* comprising a second metal oxide, to cover the step 105*s* of the lower electrode 105 and have, above the step 105s, the bend 106bs that covers the step 105s; forming, above the second variable resistance layer 106b, the first variable resistance layer 106a comprising a first metal oxide having a degree of oxygen deficiency that is higher than a degree of oxygen deficiency of the second metal oxide; and forming the upper electrode 107 above the first variable resistance layer 106a, wherein in the forming of the lower electrode 105, the step 105s is formed so that, as seen from above, the step 105s has only one corner in the surface of the lower electrode 105. Stated differently, the bend 106bs is formed in such a way that, when seen from above, the bend 106bs has only one corner in the surface of the second variable resistance layer 106b after patterning.

Here, in the process of forming the lower electrode 105, the step 105s is formed in such a way that, in the surface of the lower electrode 105, the corner of the step 105s as seen from above is located at the center.

The first manufacturing method of the nonvolatile memory element 20 in Embodiment 2 shall be described in detail below.

First, as shown in FIG. 10 (a) and FIG. 11 (a), in the process of forming the conductive layer 105" (the lower electrode 105), planarization polishing using the CMP method is performed on the entire surface of the wafer to form the conductive layer 105" (film thickness: 20 to 100 nm) which becomes the lower electrode 105 after patterning.

Next, as shown in FIG. 10 (b) and FIG. 11 (b), in a process of forming a step 105s1, which later becomes the step 105s, in the conductive layer 105", the rectangular-shaped step 105s1 (height: 1 to 30 nm) having four corners across plural variable resistance elements is formed by etching using the desired mask. It should be noted that, in FIG. 11, a variable resistance element (variable resistance layer 106) formed in a later process is shown using dotted lines. Moreover, although an example is described here in which the region inside the black solid line in FIG. 11 (b) is etched using a mask and becomes a depression, conversely, the region outside the black solid line may be etched to become a depression.

At this time, one of the corners of the rectangle-shape is disposed so as to be included in a variable resistance element, and such corner is, for example, disposed in the vicinity of the center of the variable resistance element. With this, a filament can be formed in the vicinity of the center of the variable resistance element which is away from the edges of the variable resistance element, and thus it is possible to reduce the effects of misalignment with a mask and etching damage in the formation of the variable resistance element caused by miniaturization.

Furthermore, in order not to cause etching damage to the lower electrode 105, an inert gas such as Ar and the like may be used as the etching gas.

Next, as shown in FIG. 10 (c) and FIG. 11 (c), in the process of forming the second variable resistance layer 106b', the second variable resistance layer 106b' comprising the second metal oxide having a degree of oxygen deficiency lower than the degree of oxygen deficiency of the first metal oxide (the first variable resistance layer 106a') is formed on the conductive layer 105" and covering the step 105s1 of the conductive layer 105". Here, the second variable resistance layer 106b' is formed using what is called a reactive sputtering method in which sputtering is performed on a tantalum target in an oxygen gas atmosphere. The oxygen content atomic percentage of the second variable resistance layer 106b' is 67 to 71 atm %, the resistivity is $10^7$ mΩcm or greater, and the film thickness is 2 to 10 nm. A bend 106bs1 which later becomes the bend 106bs is formed above the step 105s in the surface of the conductive layer 105". Here, the film thickness (film thickness on the side wall of the step 105s1) of the bend 106bs1 of the second variable resistance layer 106b' can be adjusted to be thin according to the height of the step 105s1 base, and a thin-film part can be formed locally in a stable manner. Furthermore, compared to the flat part of the second variable resistance layer 106b', the film property tends to become sparse in the bend 106bs1 of the second variable resistance layer 106b', and thus a film that allows easy breaking can be realized. Although the second variable resistance layer 106b' is formed using reactive sputtering in the above-described process, the second variable resistance layer 106b' may be formed by using a reactive sputtering method in which sputtering is performed on a tantalum oxide target in an oxygen gas atmosphere.

Next, as shown in FIG. 10 (d) and FIG. 11 (d), in the process of forming the first variable resistance layer 106a', the first variable resistance layer 106a' comprising the first metal oxide is formed on the second variable resistance layer 106b'. The first variable resistance layer 106a' is formed with what is called a reactive sputtering method in which sputtering is performed on a tantalum target in an argon and oxygen gas atmosphere. The oxygen content atomic percentage of the first variable resistance layer 106a' is 40 to 65 atm %, the resistivity is 0.2 to 50 mΩcm, and the film thickness is 20 to 100 nm. Subsequently, in the process of forming the conductive layer 107' (the upper electrode 107), the conductive layer 107' comprising a noble metal (platinum, iridium, palladium, and so on) which becomes the upper electrode 107 after patterning is formed on the first variable resistance layer 106a'.

Next, as shown in FIG. 10 (e) and FIG. 11 (f), in the process of forming the variable resistance element, patterning using the desired mask is performed on the conductive layer 105", the second variable resistance layer 106b', the first variable resistance layer 106a', and the conductive layer 107' to form the variable resistance element in which the variable resistance layer 106 configured of the stacked layers of the second variable resistance layer 106b and the first variable resistance layer 106a is held between the lower electrode 105 and the upper electrode 107. At this time, the step 105s and the bend 106bs are also formed at the same time.

With regard to the subsequent processes, the nonvolatile memory element 20 is completed through the same method as in FIG. 4 (d). Stated differently, a nonvolatile memory device including plural nonvolatile memory elements 20 is completed. In the nonvolatile memory device, among the respective nonvolatile memory elements 20 (four in FIG. 11 (f)), the relative positional relationship between the one corner of the bend 106bs and the two straight parts making up the one corner as seen from above is the same. Therefore, the orientation of the corner of the bend 106bs of one of the variable resistance elements as seen from above is the same as the orientation of the bend 106bs of the other variable resistance elements as seen from above. For example, as shown in FIG. 11 (f), the orientation of the corner of the respective bends 106bs of the four adjacent variable resistance elements is towards the upper left.

As described above, according to the first manufacturing method in Embodiment 2, it is possible to reflect the shape of the step of the surface of the lower electrode 105 and thereby stably form the bend 106bs in the second variable resistance layer 106b above the step 106az, and thus it is possible to cause the break phenomenon even with a low voltage, with the bend 106bs as a starting point.

Furthermore, since the shape of the step can be formed in an intentional and controlled manner, the shape of the bend 106bs of the second variable resistance layer 106b is stable, and thus variation in break voltage and resistance change characteristics among elements can be suppressed.

Furthermore, since a filament is created within the variable resistance element with just a single corner of the step 105s as a starting point, a filament can be formed in the vicinity of the center of the variable resistance element which is away from the edges of the variable resistance element.

Furthermore, since the single step 105s is formed by performing a masking process only once, it is possible to reduce the effects of misalignment with a mask for the formation of the variable resistance element caused by miniaturization, and miniaturization and increased capacity of memories can be realized.

It should be noted that, in the process of forming the step 105s1 shown in FIG. 10 (b) and FIG. 11 (b), the step 105s1 is formed in such a way that the smallest dimension of the step 105s1 of the conductive layer 105" before patterning (i.e., one side of the opening of the mask) as seen from above is less than the smallest dimension of the lower electrode 105 after patterning as seen from above. However, the step 105s1 may be formed in such a way that the smallest dimension of the step 105s1 of the conductive layer 105" before patterning as seen from above is greater than the smallest dimension of the lower electrode 105 after patterning as seen from above.

In this case, the smallest dimension of the step 105s1 is the length of the shortest side when the step 105s1 of the conductive layer 105" before patterning as seen from above is of a polygonal shape, and is the length of the smallest diameter when the step 105s1 is of an elliptical shape or circular shape. In the same manner, the smallest dimension of the lower electrode 105 is the length of the shortest side when the lower electrode 105 after patterning as seen from above is of a polygonal shape, and is the length of the smallest diameter when such lower electrode 105 is of an elliptical shape or circular shape.

It should be noted that, in the above-described process, in the process of forming the variable resistance element, after depositing the conductive layer 105", the second variable resistance layer 106b', the first variable resistance layer 106a', and the conductive layer 107', patterning is performed collectively on the respective layers using the desired mask, to thereby form the variable resistance element in which the variable resistance layer 106 configured of the stacked layers of the second variable resistance layer 106b and the first variable resistance layer 106a is held between the lower electrode 105 and the upper electrode 107.

However, the variable resistance element may be formed by patterning an individual layer each time one of the respective layers described above is formed. In other words, in the process of forming the lower electrode 105, after the conductive layer 105" is formed, the step 105s1 is formed in the surface of the conductive layer 105", and patterning is performed on the conductive layer 105" in which the step 105s1 is formed, to thereby form the lower electrode 105 having the single step 105s in the surface. Subsequently, in the process of forming the first variable resistance layer 106a, after the first variable resistance layer 106a' is formed, patterning is performed on the formed first variable resistance layer 106a' to thereby form the first variable resistance layer 106a. Then, in the process of forming the second variable resistance layer 106b, after the second variable resistance layer 106b' is formed, patterning is performed on the formed second variable resistance layer 106b' to thereby form the second variable resistance layer 106b. Then, in the process of forming the upper electrode 107, after the conductive layer 107' is formed, patterning is performed on the formed conductive layer 107' to thereby form the upper electrode 107. Thus, the variable resistance element may be formed through a process such as that described above.

[Second Manufacturing Method]

Figure 12:
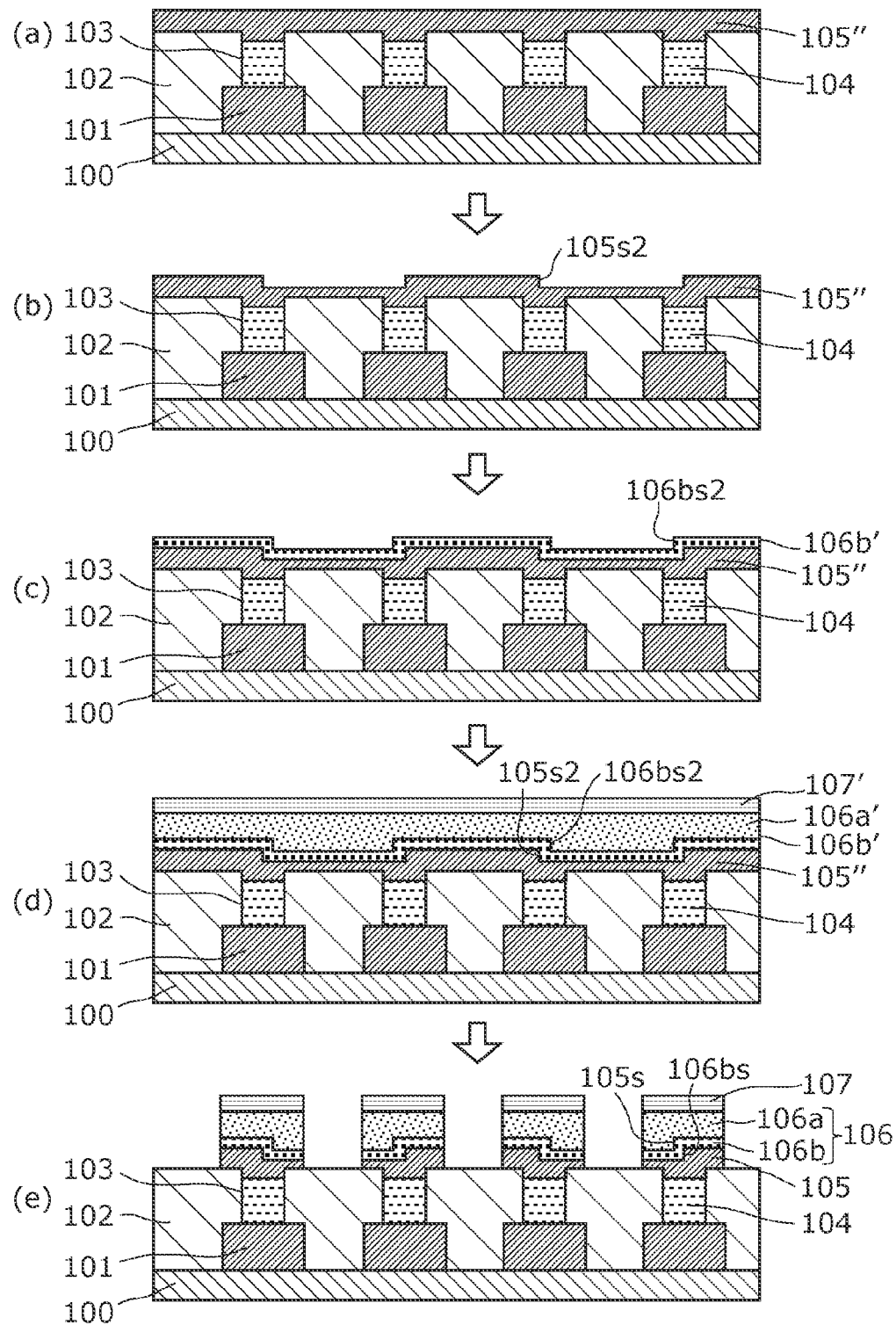
FIG. 12 shows, in (a) to (e), cross-sectional views illustrating a second manufacturing method for main parts of the nonvolatile memory element in Embodiment 2 of the present invention.

FIG. 12 (a) to (e) are cross-sectional views illustrating a second manufacturing method for main parts of the nonvolatile memory element 20 in Embodiment 2 of the present invention. Furthermore, FIG. 13 (a) to (f) are plan views illustrating the nonvolatile memory element 20 as seen from above, corresponding to the respective processes from FIG. 12 (a) to (e). The second manufacturing method for the main parts of the nonvolatile memory element 20 in Embodiment 2 shall be described using these figures. It should be noted that processes prior to FIG. 12 (a) are the same as those in FIG. 3 (a) to (b), and thus description thereof shall not be repeated below.

Figure 13:
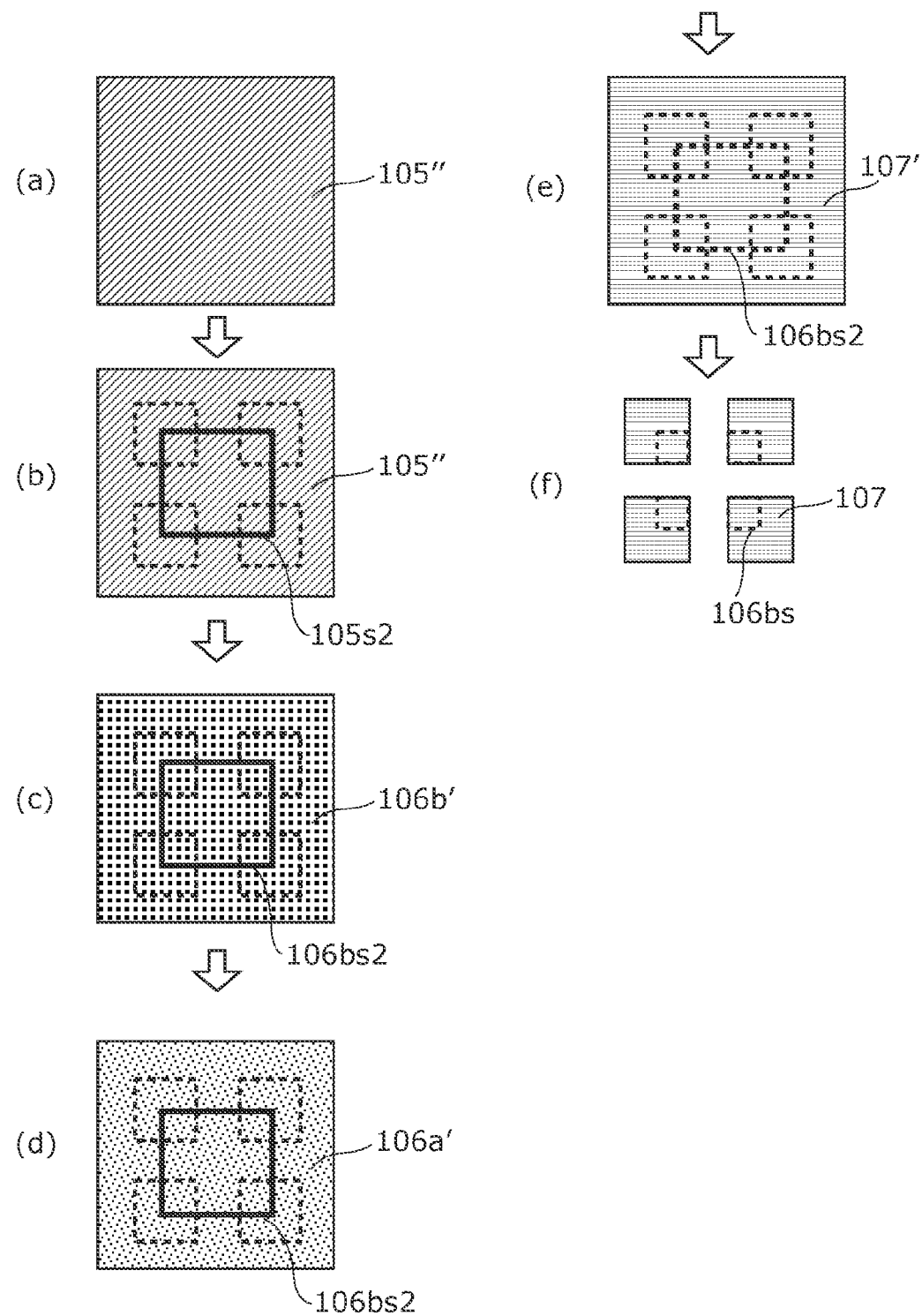
FIG. 13 shows, in (a) to (f), cross-sectional views illustrating a second manufacturing method for main parts of the nonvolatile memory element in Embodiment 2 of the present invention.
Figure 17A:
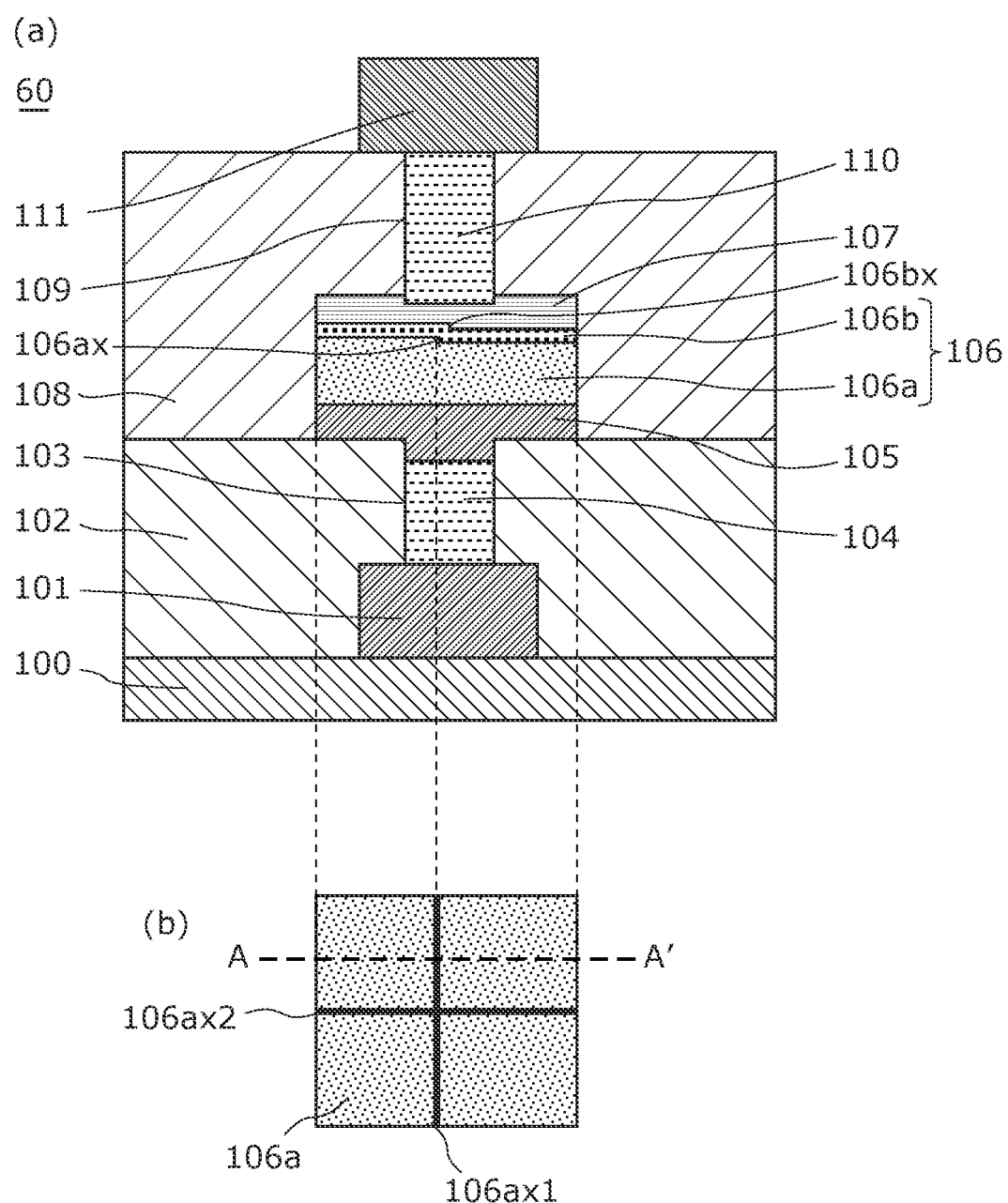
FIG. 17A shows, in (a), a cross-sectional view showing an exemplary configuration of a conventional third nonvolatile memory element, and shows, in (b), a plan view of a first variable resistance layer of the conventional third nonvolatile memory element.
Figure 17B:
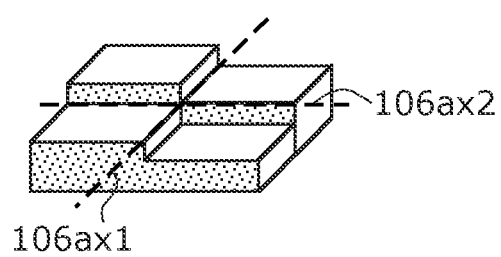
FIG. 17B is a plan view of the first variable resistance layer of the conventional third nonvolatile memory device.

As shown in FIG. 12 and FIG. 13, the second method of manufacturing the nonvolatile memory element 20 in this embodiment is different from the first method of manufacturing in that: in the forming of the lower electrode 105, the lower electrode 105 having the single step 105s in the surface is formed by forming the conductive layer 105", forming the step 105s2 in the surface of the formed conductive layer 105", and patterning the conductive layer 105" in which the step 105s2 has been formed; and in the forming of the lower electrode 105, the step 105s2 is formed so that a side the distance (smallest dimension) between adjacent steps 105s2 of the conductive layer 105" before the patterning in which the step 105s2 has been formed as seen from above is larger than the smallest dimension of the lower electrode 105 after the patterning as seen from above.

The method of manufacturing a nonvolatile memory device including a plurality of the nonvolatile memory elements 20, using the second method of manufacturing the nonvolatile memory element 20 includes: in the forming of the lower electrode 105, separating the single conductive layer 105" into a plurality of the lower electrodes 105 corresponding to the nonvolatile memory elements 20 through the patterning; and in the forming of the lower electrode 105, forming the step 105s2 so that the single step 105s2 of the conductive layer 105" before the patterning in which the step 105s2 has been formed, as seen from above, extends across the lower electrodes 105 after the patterning.

The second manufacturing method of the nonvolatile memory element 20 in Embodiment 2 shall be described in detail below.

First, as shown in FIG. 12 (a) and FIG. 13 (a), in the process of forming the conductive layer 105" (the lower electrode 105), planarization polishing using the CMP method is performed on the entire surface of the wafer to form the conductive layer 105" (film thickness: 20 to 100 nm) which becomes the lower electrode 105 after patterning.

Next, as shown in FIG. 12 (b) and FIG. 13 (b), in a process of forming a step 105s2, which later becomes the step 105s, in the conductive layer 105", the rectangular-shaped step 105s2 (height: 1 to 30 nm) having four corners across plural variable resistance elements is formed by etching using the desired mask. It should be noted that, in FIG. 13, a variable resistance element (variable resistance layer 106) formed in a later process is shown using dotted lines. Moreover, although an example is described here in which the region inside the black solid line in FIG. 13 (b) is etched using a mask and becomes a depression, conversely, the region outside the black solid line may be etched to become a depression.

At this time, each of the corners of the rectangular shape is disposed so as to be included in a different one of the four adjacent variable resistance elements, and the corner is, for example, disposed in the vicinity of the center of the corresponding variable resistance element. With this, a filament can be formed in the vicinity of the center of the variable resistance element which is away from the edges of the variable resistance element, and thus it is possible to reduce the effects of misalignment with a mask and etching damage in the formation of the variable resistance element caused by miniaturization. In addition, the need to form the rectangular step pattern to be planarly smaller than the variable resistance element is eliminated, and thus the problem of miniaturization being limited by the rectangular-shaped step pattern can also be solved.

Furthermore, in order not to cause etching damage to the lower electrode 105, an inert gas such as Ar and the like may be used as the etching gas.

Next, as shown in FIG. 12 (*c*) and FIG. 13 (*c*), in the process of forming the second variable resistance layer 106*b*', the second variable resistance layer 106*b*' comprising the second metal oxide having a degree of oxygen deficiency lower than the degree of oxygen deficiency of the first metal oxide (the first variable resistance layer 106*a*') is formed on the conductive layer 105" and covering the step 105*s*2 of the conductive layer 105". Here, the second variable resistance layer 106*b*' is formed using what is called a reactive sputtering method in which sputtering is performed on a tantalum target in an oxygen gas atmosphere. The oxygen content atomic percentage of the second variable resistance layer 106*b*' is 67 to 71 atm %, the resistivity is 107 mΩcm or greater, and the film thickness is 2 to 10 nm. A bend 106*bs*2 which later becomes the bend 106*bs* is formed above the step 105*s*2 in the surface of the conductive layer 105". Here, the film thickness (film thickness on the side wall of the step 105*s*2) of the bend 106*bs*2 of the second variable resistance layer 106*b*' can be adjusted to be thin according to the height of the step 105*s*2 base, and a thin-film part can be formed locally in a stable manner. Furthermore, compared to the flat part of the second variable resistance layer 106W, the film property tends to become sparse in the bend 106*bs*2 of the second variable resistance layer 106*b*', and thus a film that allows easy breaking can be realized. Although the variable resistance layer is formed using reactive sputtering in the above-described process, the variable resistance layer may be formed by using a reactive sputtering method of performing sputtering on a tantalum oxide target in an oxygen gas atmosphere.

Next, as shown in FIG. 12 (*d*) and FIG. 13 (*e*), in the process of forming the first variable resistance layer 106*a*', the first variable resistance layer 106*a*' comprising the first metal oxide is formed on the second variable resistance layer 106*b*'. The first variable resistance layer 106*a*' is formed with what is called a reactive sputtering method in which sputtering is performed on a tantalum target in an argon and oxygen gas atmosphere. The oxygen content atomic percentage of the first variable resistance layer 106*a*' is 40 to 65 atm %, the resistivity is 0.2 to 50 mΩcm, and the film thickness is 20 to 100 nm. Subsequently, in the process of forming the conductive layer 107' (the upper electrode 107), the conductive layer 107' comprising a noble metal (platinum, iridium, palladium, and so on) which becomes the upper electrode 107 after patterning is formed on the first variable resistance layer 106*a*'.

Next, as shown in FIG. 12 (*e*) and FIG. 13 (*f*), in the process of forming the variable resistance element, patterning using the desired mask is performed on the conductive layer 105", the second variable resistance layer 106*b*', the first variable resistance layer 106*a*', and the conductive layer 107' to form the variable resistance element in which the variable resistance layer 106 configured of the stacked layers of the second variable resistance layer 106*b* and the first variable resistance layer 106*a* is held between the lower electrode 105 and the upper electrode 107. At this time, the step 105*s* and the bend 106*bs* are also formed at the same time. Furthermore, the difference with the first manufacturing method is that the orientation of the step 105*s* of the lower electrode 105 is reversed in an adjacent variable resistance element.

With regard to the subsequent processes, the nonvolatile memory element 20 is completed through the same method as in FIG. 4 (*d*). Stated differently, a nonvolatile memory device including plural nonvolatile memory elements 20 is completed. In the nonvolatile memory device, among the respective nonvolatile memory elements 20 (four in FIG. 13 (*f*)), the relative positional relationship between the one corner of the bend 106*bz* and the two straight parts making up the one corner as seen from above is different. Therefore, the orientation of the corner of the bend 106*bz* of one of the variable resistance elements as seen from above is different from the orientation of the bend 106*bz* of the other variable resistance elements as seen from above. For example, as shown in FIG. 13 (*f*), the orientations of the corners of the respective bends 106*bs* of the four adjacent variable resistance elements are: the top left for the top left variable resistance element; the top right for the top right variable resistance element; the bottom left for the bottom left variable resistance element; and the bottom right for the bottom right variable resistance element, and thus the orientations of the four corners are all different.

As described above, according to the second manufacturing method in Embodiment 2, it is possible to reflect the shape of the step of the surface of the lower electrode 105 and thereby stably form the bend 106*bs* in the second variable resistance layer 106*b* above the step 105*s*, and thus it is possible to cause the break phenomenon even with a low voltage, with the bend 106*bs* as a starting point.

Furthermore, since the shape of the step can be formed in an intentional and controlled manner, the shape of the bend 106*bs* of the second variable resistance layer 106*b* is stable, and thus variation in break voltage and resistance change characteristics among elements can be suppressed.

Furthermore, since a filament is created within the variable resistance element with just a single corner of the step 105*s* as a starting point, a filament can be formed in the vicinity of the center of the variable resistance element which is away from the edges of the variable resistance element.

Furthermore, since the single step 105*s* is formed by performing a masking process only once, it is possible to reduce the effects of misalignment with a mask for the formation of the variable resistance element caused by miniaturization, and miniaturization and increased capacity of memories can be realized.

Furthermore, compared to the first manufacturing method, the need to form the rectangular step pattern to be planarly smaller than the variable resistance element is eliminated, and thus the problem of miniaturization being limited by the rectangular-shaped step pattern can be solved.

It should be noted that, in the second manufacturing method in Embodiment 2, the steps 105*s* of four variable resistance elements, that is, four bends 106*bs* are formed at the same time, and thus the rectangular-shaped step 105*s*2 having four corners is formed. However, when the steps 105*s*, that is, the bends 106*bs*, of two variable resistance elements are to be formed at the same time, it is sufficient that a step 105*s*2 having two corners is formed.

It should be noted that, in the same manner as in the first manufacturing method according to Embodiment 2 described earlier, even in the second manufacturing method, the variable resistance element may be formed by patterning an individual layer each time one of the layers of the conductive layer 105'', the second variable resistance layer 106b', the first variable resistance layer 106a', and the conductive layer 107' is formed.

Embodiment 3

[Element Configuration]

FIG. 14 (*a*) is a cross-sectional view (cross-sectional view at A-A' in FIG. 14 (*b*)) of an exemplary configuration of a nonvolatile memory element 30 in Embodiment 3 of the present invention, and FIG. 14 (*b*) is a plan view of the first variable resistance layer 106a in FIG. 14 (*a*).

As shown in FIG. 14, the difference between the nonvolatile memory element 30 in Embodiment 3 and the nonvolatile memory element 10 in Embodiment 1 is that a lower electrode 112 of a diode element, a semiconductor layer 113, and an upper electrode 114 of the diode element, that is, a diode element is integrated below the variable resistance element. In other words, the difference is that an element is formed by integrating the variable resistance element and the diode element. Since the rest of the configuration is the same as in Embodiment 1, description thereof shall not be repeated.

It should be noted that although the nonvolatile memory element 30 has a structure in which the upper electrode 114 of the diode element and the bottom electrode 105 of the variable resistance element are shared, these electrodes may be configured separately.

In the nonvolatile memory element 30, the surface of the lower electrode 112 of the diode element is planarized, and the surface of the element film of the semiconductor layer 113 formed above it is formed to be approximately flat. Furthermore, as in the nonvolatile memory element 10, the single step 106az including one corner and two straight parts is formed in the surface of the first variable resistance layer 106a.

As described above, according to the configuration of the nonvolatile memory element 30 in Embodiment 3, although the lower electrode 112 of the diode element is also formed in the part of the recess created above the first contact plug 104 inside the first contact hole 103, the surface of the lower electrode 112 of the diode element is formed flat. Since the semiconductor layer 113 can be formed on a planarized base, variation in the film thickness thereof can be greatly reduced, and it is possible to obtain stable rectifying characteristics of an MSM diode in which the semiconductor layer 113 is held between upper and lower electrodes. Meanwhile, in the variable resistance element, the bend 106bz of the second variable resistance layer 106b is formed above the step 106az of the first variable resistance layer 106a, and thus it is possible to cause the initial break phenomenon even with a low voltage, with the bend 106bz as a starting point.

Furthermore, since the shape of the step 106az is formed in an intentional and controlled manner, the shape of the bend 106bz of the second variable resistance layer 106b is stable, and thus variation in break voltage and resistance change characteristics among elements can be suppressed.

Furthermore, since a filament is created within the variable resistance element with just a single corner of the bend 106az as a starting point, a filament can be formed in the vicinity of the center of the variable resistance element which is away from the edges of the variable resistance element. As a result, it becomes possible to reduce the impact of misalignment with the mask for forming the variable resistance element caused by miniaturization, and thus miniaturization and increased capacity of memories can be realized.

In a memory cell structure in which the variable resistance element and the diode element are connected in series such as that described above, it is necessary to add a voltage portion to be distributed to the diode element and raise the voltage to be applied to the memory cell, and thus the demand for lowering the voltage becomes greater. In response to this, in the nonvolatile memory element 30 in Embodiment 3, the break voltage of the variable resistance element can be lowered, and thus the voltage applied to the entire cell can be reduced. Furthermore, since the break phenomenon of the variable resistance element occurs locally, transient current flowing at the time of the break can be reduced. With this, destruction of the diode element can also be prevented.

It should be noted that although the diode element is formed below the lower electrode 112 and in contact with the lower electrode 112 in Embodiment 3, the diode element may be formed above the upper electrode 107 and in contact with the upper electrode 107.

Furthermore, the diode-equipped configuration in this embodiment can also be applied to the configuration in Embodiment 2 shown in FIG. 8. In this case, the diode element configured of the lower electrode of the diode element, the semiconductor layer, and the upper electrode of the diode element may be formed above the upper electrode 107 and in contact with the upper electrode 107.

(Modifications of Embodiments 1 to 3)

Although, in the respective embodiments described above, the variable resistance layer is configured of a stacked structure of tantalum oxide layers, the above described operation and effect of the present invention are manifested not only in the case of tantalum oxide layers, and thus the present invention is not limited to the above configuration. For example, the variable resistance layer may be configured of a different metal oxide layer (transitional metal oxide layer or aluminum oxide layer) such as a stacked structure of hafnium (Hf) oxide layers or a stacked structure of zirconium (Zr) oxide layers.

For example, in the case of adopting a stacked structure of hafnium oxide layers, when the composition of a first hafnium oxide layer is $HfO_x$ and the composition of a second hafnium oxide layer is $HfO_y$, it is preferable that $0.9 \leq x \leq 1.6$ and $1.8 < y < 2.0$ are approximately satisfied, and that the film thickness of the second hafnium oxide layer be between 3 nm and 4 nm, inclusive.

Furthermore, in the case of adopting a stacked structure of zirconium oxide layers, when the composition of a first zirconium oxide layer is $ZrO_x$ and the composition of a second zirconium oxide layer is $ZrO_y$, it is preferable that $0.9 \leq x \leq 1.4$ and $1.9 < y < 2.0$ are approximately satisfied, and that the film thickness of the second zirconium oxide layer be between 1 nm and 5 nm, inclusive.

Furthermore, in the case of adopting hafnium oxide layers, the first hafnium oxide layer is formed on the lower electrode through what is called the reactive sputtering method in which sputtering is performed in an argon gas and oxygen gas atmosphere using a Hf target. The second hafnium oxide layer can be formed after the forming of the first hafnium oxide layer, by exposing the surface of the first hafnium oxide layer to argon gas and oxygen gas plasma. The degree of oxygen deficiency of the first hafnium oxide layer is the same as in the case of the above-described tantalum oxide layer, and can be easily adjusted by changing the flow ratio of oxygen gas to argon gas in the reactive sputtering. It should be noted that, with regard to the substrate temperature, heating is not necessary and room temperature is acceptable.

Furthermore, the film thickness of the second hafnium oxide layer can be easily adjusted through the exposure time to the argon gas and oxygen gas plasma. When the composition of the first hafnium oxide layer is HfO$_x$ and the composition of the second hafnium oxide layer is HfO$_y$, it is possible to realize stable resistance change characteristics when 0.9≤x≤1.6 and 1.8>y<2.0 are satisfied, and the film thickness of the second hafnium oxide layer is within a range of 3 nm to 4 nm, inclusive.

In the case of adopting zirconium oxide layers, the first zirconium oxide layer is formed on the lower electrode with what is called the reactive sputtering method in which sputtering is performed in an argon gas and oxygen gas atmosphere using a Zr target. The second zirconium oxide layer can be formed after the forming of the first zirconium oxide layer, by exposing the surface of the first zirconium oxide layer to argon gas and oxygen gas plasma. The degree of oxygen deficiency of the first zirconium oxide layer is the same as in the case of the above-described tantalum oxide layer, and can be easily adjusted by changing the flow ratio of oxygen gas to argon gas in the reactive sputtering. It should be noted that, with regard to the substrate temperature, heating is not necessary and room temperature is acceptable.

Furthermore, the film thickness of the second zirconium oxide layer can be easily adjusted through the exposure time to the argon gas and oxygen gas plasma. When the composition of the first zirconium oxide layer is ZrO$_x$ and the composition of the second hafnium oxide layer is ZrO$_y$, it is possible to realize stable resistance change characteristics when 0.9≤x≤1.4 and 1.9<y<2.0 are satisfied, and the film thickness of the second zirconium oxide layer is within a range of 1 nm to 5 nm, inclusive.

Furthermore, the respective materials of the upper electrode and the lower electrode described in Embodiments 1 to 3 are examples, and other materials may be used. For example, for the upper electrode (the electrode which corresponds to the lower electrode in FIG. 8 through FIG. 13, and is in contact with the metal oxide layer with the lower degree of oxygen deficiency) it is possible to use, aside from Pt, Ir, Pd, a material having a standard electrode potential higher than the standard electrode potential of the metal included in the metal oxide of the variable resistance layer such as gold (Au), copper (Cu), and silver (Ag), and the like. For the lower electrode (the electrode which corresponds to the upper electrode in FIG. 8 through FIG. 13, and is in contact with the metal oxide layer with the higher degree of oxygen deficiency), it is acceptable to use, aside from TaN, a material having a standard electrode potential lower than the standard electrode potential of the metal included in the upper electrode such as tungsten (W), nickel Ni), and the like.

Furthermore, providing a bend in the second variable resistance layer in Embodiments 1 to 3 includes the case where the step in the interface between the first variable resistance layer and the second variable resistance layer is transferred onto a position in the surface of the second variable resistance layer that corresponds to such step. Furthermore, in the second variable resistance layer, the film thickness in the bend may be thinner than in the other parts of the second variable resistance layer, or may be the same as in the other parts.

Furthermore, although the step is formed before patterning in Embodiments 1 to 3, the step may be formed after patterning. Specifically, in the forming of the first variable resistance layer, after the patterning of the first variable resistance layer is performed, the step may be formed in the surface of the patterned first variable resistance layer. In this case, the second variable resistance layer is formed on the first variable resistance layer having the step in the surface, and the patterning of the second variable resistance layer is performed. In the same manner, in the forming of the lower electrode, after the patterning of the conductive layer which becomes the lower electrode is performed, the step may be formed in the surface of the patterned conductive layer. In this case, the second variable resistance layer is formed on the lower electrode having the step in the surface, and the patterning of the second variable resistance layer is performed.

Furthermore, in Embodiments 1 to 3, the lower electrode, the first variable resistance layer, the second variable resistance layer, and the upper electrode are formed by forming variable resistance layers and electrodes corresponding to the respective variable resistance layers and respective electrodes and subsequently patterning the formed variable resistance layers and electrodes collectively, using a mask pattern. However, the lower electrode, the first variable resistance layer, the second variable resistance layer, and the upper electrode may be formed by forming a mask pattern and subsequently forming, using the mask pattern, variable resistance layers and electrodes corresponding to the respective variable resistance layers and respective electrodes.

Although the variable resistance elements, variable resistance devices, and methods of manufacturing the same according to the present invention have been described based on an embodiments, the present invention is not limited to such embodiments. Various modifications that may be conceived by those skilled in the art which do not depart from the essence of the present invention are intended to be included within the scope of the present invention. Furthermore, respective constituent elements of different embodiments may be arbitrarily combined within a scope that does not depart from the essence of the present invention.

INDUSTRIAL APPLICABILITY

The present invention provides variable resistance nonvolatile memory elements, nonvolatile memory devices, and methods of manufacturing the same, and is useful in various electronic device fields that use a nonvolatile memory because the present invention can realize a nonvolatile memory which operates in a stable manner and is highly reliable.

REFERENCE SIGNS LIST

10, 20, 30 Nonvolatile memory element
40 First nonvolatile memory element
50 Second nonvolatile memory element
60 Third nonvolatile memory element
100 Substrate
101 First line
102 First interlayer insulating layer
103 First contact hole
104 First contact plug
105', 105", 107" Conductive layer
105, 112 Lower electrode
105*d*, 105*u*, 106*au*, 106*ad* Region
105*s*, 105*s*1, 105*s*2, 106*ax*, 106*ax*1, 106*ax*2, 106*ay*, 106*az*, 106*az*1, 106*az*2 Step
106 Variable resistance layer
106*a*, 106*a'* First variable resistance layer (low oxygen content layer, low resistance layer)
106*b*, 106*b'* Second variable resistance layer (high oxygen content layer, high resistance layer)
106*bx*, 106*by*, 106*bz*, 106*bz*1, 106*bz*2, 106*bs*, 106*bs*1, 106*bs*2 Bend
107 Upper electrode
108 Second interlayer insulating layer
109 Second contact hole
110 Second contact plug 111 Second line
113 Semiconductor layer

The invention claimed is:

1. A method of manufacturing a nonvolatile memory element, the method comprising:
    forming a lower electrode above a substrate;
    forming a first variable resistance layer above the lower electrode, the first variable resistance layer comprising a first metal oxide and having a single step in a surface;
    forming a second variable resistance layer to cover the step of the first variable resistance layer and to have, above the step, a stepped portion that covers the step, the second variable resistance layer comprising a second metal oxide having a degree of oxygen deficiency that is lower than a degree of oxygen deficiency of the first metal oxide; and
    forming an upper electrode above the second variable resistance layer,
    wherein in the forming of a first variable resistance layer, the step is formed so that the step is at most a single step and, as seen from above, has only one corner in the surface of the first variable resistance layer.

2. The method of manufacturing a nonvolatile memory element according to claim 1,
    wherein in the forming of a first variable resistance layer, the step is formed so that, as seen from above, the corner of the step is located at a center in the surface of the first variable resistance layer.

3. The method of manufacturing a nonvolatile memory element according to claim 1,
    wherein in the forming of a first variable resistance layer, the first variable resistance layer having the single step in the surface is formed by forming the first variable resistance layer, forming the step in the surface of the formed first variable resistance layer, and patterning the first variable resistance layer in which the step has been formed, and
    in the forming of a first variable resistance layer, the step is formed so that a side of an opening of a mask used for forming the step is larger than a smallest dimension of the first variable resistance layer after the patterning as seen from above.

4. The method of manufacturing a nonvolatile memory element according to claim 1,
    wherein in the forming of a first variable resistance layer, the first variable resistance layer having the single step in the surface is formed by forming the first variable resistance layer, forming the step in the surface of the formed first variable resistance layer, and patterning the first variable resistance layer in which the step has been formed, and
    in the forming of a first variable resistance layer, the step is formed so that a side of a mask used for forming the step is larger than a smallest dimension of the first variable resistance layer after the patterning as seen from above.

5. A method of manufacturing a nonvolatile memory device including a plurality of the nonvolatile memory elements, using the method of manufacturing a nonvolatile memory element according to claim 3, the method of manufacturing a nonvolatile memory device comprising:
    in the forming of a first variable resistance layer, separating the single first variable resistance layer into a plurality of the first variable resistance layers corresponding to the nonvolatile memory elements through the patterning; and
    in the forming of a first variable resistance layer, forming the step so that the single step of the first variable resistance layer before the patterning in which the step has been formed, as seen from above, extends across the first variable resistance elements after the patterning.

6. A method of manufacturing a nonvolatile memory element, the method comprising:
    forming a lower electrode above a substrate, the lower electrode having a single step in a surface;
    forming a second variable resistance layer to cover the step of the lower electrode and to have, above the step, a stepped portion that covers the step, the second variable resistance layer comprising a second metal oxide;
    forming a first variable resistance layer above the second variable resistance layer, the first variable resistance layer comprising a first metal oxide having a degree of oxygen deficiency that is higher than a degree of oxygen deficiency of the second metal oxide; and
    forming an upper electrode above the first variable resistance layer,
    wherein, in the forming of a lower electrode, the step is formed so that the step is at most a single step and, as seen from above, has only one corner in the surface of the lower electrode.

7. The method of manufacturing a nonvolatile memory element according to claim 6,
    wherein in the forming of a lower electrode, the step is formed so that, as seen from above, the corner of the step is located at a center in the surface of the lower electrode.

8. The method of manufacturing a nonvolatile memory element according to claim 6,
    wherein in the forming of a lower electrode, the lower electrode having the single step in the surface is formed by forming the lower electrode, forming the step in the surface of the formed lower electrode, and patterning the lower electrode in which the step has been formed, and
    in the forming of a lower electrode, the step is formed so that a side of an opening of a mask used for forming the step is larger than a smallest dimension of the lower electrode after the patterning as seen from above.

9. A method of manufacturing a nonvolatile memory device including a plurality of the nonvolatile memory elements, using the method of manufacturing a nonvolatile memory element according to claim 8, the method of manufacturing a nonvolatile memory device comprising:
    in the forming of a lower electrode, separating the single lower electrode into a plurality of the lower electrodes corresponding to the nonvolatile memory elements through the patterning; and
    in the forming of a lower electrode, forming the step so that the single step of the lower electrode before the patterning in which the step has been formed, as seen from above, extends across the lower electrodes after the patterning.

10. A nonvolatile memory element comprising:
    a substrate;
    a lower electrode formed above the substrate;
    a first variable resistance layer formed above the lower electrode and comprising a first metal oxide;
    a second variable resistance layer formed above the first variable resistance layer and comprising a second metal oxide having a degree of oxygen deficiency that is lower than a degree of oxygen deficiency of the first metal oxide; and
    an upper electrode formed above the second variable resistance layer,
    wherein at most a single step is formed in an interface between the first variable resistance layer and the second variable resistance layer, the second variable resistance layer is formed to cover the step and to have, above the step, a stepped portion that covers the step, and the stepped portion, as seen from above, has only one corner in a surface of the second variable resistance layer.

11. A nonvolatile memory element comprising:

a substrate;

a lower electrode formed above the substrate;

a second variable resistance layer formed above the lower electrode and comprising a second metal oxide;

a first variable resistance layer formed above the second variable resistance layer and comprising a first metal oxide having a degree of oxygen efficiency that is higher than a degree of oxygen deficiency of the second metal oxide; and an upper electrode formed above the first variable resistance layer, wherein at most a single step is formed in an interface between the lower electrode and the second variable resistance layer, the second variable resistance layer is formed to cover the step and to have, above the step, a stepped portion that covers the step, and the stepped portion, as seen from above, has only one corner in a surface of the second variable resistance layer.

12. The nonvolatile memory element according to claim 10, wherein the corner of the stepped portion, as seen from above, is located at a center in the surface of the second variable resistance layer.

13. The nonvolatile memory element according to claim 10, further comprising a contact plug below the lower electrode, wherein an interface between the lower electrode and the first variable resistance layer is flat.

14. The nonvolatile memory element according to claim 10, wherein the second variable resistance layer is an insulating layer.

15. The nonvolatile memory element according to claim 10, comprising a diode element that is in contact with the lower electrode or the upper electrode.

16. A nonvolatile memory device comprising a plurality of the nonvolatile memory elements according to claim 10, wherein a relative positional relationship between the corner of the stepped portion and two straight lines making up the corner, as seen from above, is different for each of the nonvolatile memory elements.

17. The nonvolatile memory element according to claim 11, wherein the corner of the stepped portion, as seen from above, is located at a center in the surface of the second variable resistance layer.

18. The nonvolatile memory element according to claim 11, wherein the second variable resistance layer is an insulating layer.

19. The nonvolatile memory element according to claim 11, comprising a diode element that is in contact with the lower electrode or the upper electrode.

20. A nonvolatile memory device comprising a plurality of the nonvolatile memory elements according to claim 11, wherein a relative positional relationship between the corner of the stepped portion and two straight lines making up the corner, as seen from above, is different for each of the nonvolatile memory elements.

* * * * *